(12) United States Patent
Kobata et al.

(10) Patent No.: US 7,208,076 B2
(45) Date of Patent: Apr. 24, 2007

(54) SUBSTRATE PROCESSING APPARATUS AND METHOD

(75) Inventors: Itsuki Kobata, Tokyo (JP); Mitsuhiko Shirakashi, Tokyo (JP); Masayuki Kumekawa, Tokyo (JP); Takayuki Saito, Kanagawa (JP); Yasushi Toma, Kanagawa (JP); Tsukuru Suzuki, Kanagawa (JP); Kaoru Yamada, Kanagawa (JP); Yuji Makita, Kanagawa (JP); Hozumi Yasuda, Tokyo (JP)

(73) Assignee: Ebara Corporation, Tokyo (JP)

( * ) Notice: Subject to any disclaimer, the term of this patent is extended or adjusted under 35 U.S.C. 154(b) by 182 days.

(21) Appl. No.: 10/485,177

(22) PCT Filed: Sep. 11, 2002

(86) PCT No.: PCT/JP02/09255

§ 371 (c)(1),
(2), (4) Date: Jul. 6, 2004

(87) PCT Pub. No.: WO03/030223

PCT Pub. Date: Apr. 10, 2003

(65) Prior Publication Data

US 2004/0231989 A1    Nov. 25, 2004

(30) Foreign Application Priority Data

Sep. 11, 2001   (JP)  ............................... 2001-275112
Jan. 23, 2002   (JP)  ............................... 2002-014132

(51) Int. Cl.
*C25F 7/00*      (2006.01)
*C25F 5/00*      (2006.01)
*C25F 3/14*      (2006.01)

(52) U.S. Cl. ...................... 205/652; 205/668; 204/199; 204/242

(58) Field of Classification Search .................... None
See application file for complete search history.

(56) References Cited

U.S. PATENT DOCUMENTS

| | | | |
|---|---|---|---|
| 5,486,282 | A | 1/1996 | Datta et al. |
| 6,121,152 | A | 9/2000 | Adams et al. |
| 6,368,493 | B1 | 4/2002 | Mori et al. |

(Continued)

FOREIGN PATENT DOCUMENTS

EP      0 750 334      12/1996

(Continued)

*Primary Examiner*—Harry D. Wilkins, III
(74) *Attorney, Agent, or Firm*—Wenderoth, Lind & Ponack, L.L.P.

(57) ABSTRACT

A substrate processing apparatus can perform an electrolytic processing, which is different from a common, conventional etching, to remove (clean off) a conductive material (film) formed on or adhering to a bevel portion, etc. of a substrate, or process a peripheral portion of a substrate through an electrochemical action. The substrate processing apparatus includes: an electrode section having a plurality of electrodes which are laminated with insulators being interposed, and having a holding portion which is to be opposed to a peripheral portion of a substrate; an ion exchanger disposed in the holding portion of the electrode section; a liquid supply section for supplying a liquid to the holding position of the electrode section; and a power source for applying a voltage to the electrodes of the electrode section so that the electrodes alternately have different polarities.

27 Claims, 11 Drawing Sheets

U.S. PATENT DOCUMENTS

| | | |
|---|---|---|
| 2001/0036746 A1 | 11/2001 | Sato et al. |
| 2002/0020630 A1 | 2/2002 | Mori et al. |
| 2002/0070126 A1 | 6/2002 | Segawa et al. |
| 2003/0132103 A1 | 7/2003 | Kobata et al. |

FOREIGN PATENT DOCUMENTS

| | | |
|---|---|---|
| EP | 1 079 003 | 2/2001 |
| EP | 1 104 013 | 5/2001 |
| EP | 1 139 400 | 10/2001 |
| JP | 6-315828 | 11/1994 |
| JP | 6-315829 | 11/1994 |
| JP | 10-58236 | 3/1998 |
| JP | 2000-52235 | 2/2000 |
| WO | 00 59682 | 10/2000 |
| WO | 01 52307 | 7/2001 |
| WO | 02 103771 | 12/2002 |

SUBSTRATE PROCESSING APPARATUS AND METHOD

TECHNICAL FIELD

This invention relates to a substrate processing apparatus and method, and more particularly to a substrate processing apparatus and method which can be utilized as a bevel-removal apparatus for processing a conductive material or removing impurities adhering to a peripheral portion (bevel portion or edge portion) of a substrate, such as a semiconductor wafer, or which can be used for carrying out processing to remove a film formed on the surface of a substrate by a predetermined thickness.

BACKGROUND ART

In recent years, instead of using aluminum or aluminum alloys as a material for forming interconnection circuits on a substrate such as a semiconductor wafer, there is an eminent movement towards using copper (Cu) which has a low electric resistance and high electromigration resistance. Copper interconnects are generally formed by filling copper into fine recesses formed in a surface of a substrate. There are known various techniques for forming such copper interconnects, including CVD, sputtering, and plating. According to any such technique, a copper film is formed on the substantially entire surface of a substrate, followed by removal of unnecessary copper by chemical mechanical polishing (CMP).

FIGS. 13A through 13C illustrate, in sequence of process steps, an example of forming such a substrate W having copper interconnects. As shown in FIG. 13A, an insulating film 2, such as a silicon oxide film of $SiO_2$ or a film of low-k material, is deposited on a conductive layer 1a in which electronic devices are formed, which is formed on a semiconductor base 1. A contact hole 3 and a trench 4 for interconnects are formed in the insulating film 2 by the lithography and etching technique. Thereafter, a barrier layer 5 of TaN or the like is formed on the entire surface, and a seed layer 7 as an electric supply layer for electroplating is formed on the barrier layer 5.

Then, as shown in FIG. 13B, copper plating is performed onto the surface of the substrate W to fill the contact hole 3 and the trench 4 with copper and, at the same time, deposit a copper film 6 on the insulating film 2. Thereafter, the copper film 6 and the barrier layer 5 on the insulating film 2 is removed by chemical mechanical polishing (CMP) so as to make the surface of the copper film 6 filled in the contact hole 3 and the trench 4 for interconnects and the surface of the insulating film 2 lie substantially on the same plane. An interconnection composed of the copper film 6 as shown in FIG. 13C is thus formed.

In this case, the barrier layer 5 is formed so as to cover the substantially entire surface of the insulating film 2, and the seed layer 7 is also formed so as to cover the substantially entire surface of the barrier layer 5. Thus, in some cases, a copper film that is the seed layer 7 resides on a bevel (outer peripheral portion) of the substrate W, or copper is deposited on an edge (outer peripheral portion), which is inward of the bevel of the substrate W, and remains unpolished. Copper can easily be diffused into the insulating film in a semiconductor fabrication process such as annealing, thus deteriorating the electric insulation of the insulating film, and may cause cross contamination in subsequent processes of delivering, storing and processing the substrate. For these reasons, it is necessary that the remaining deposited copper on the peripheral portion of the substrate should be completely removed. Therefore, it is suggested that conductive material such as copper deposited on or adhering to the peripheral portion of the substrate will be removed by an etching process or the like.

As described above, the impurity contamination in the production of a semiconductor device greatly affects the reliability of the semiconductor device. Accordingly, with respect to a substrate in which a film has been formed e.g. by plating over the entire surface e.g. for the formation of semiconductor interconnects or contacts, the substrate is usually subjected to a process for removing the film on a peripheral portion of the substrate in order to prevent a later contamination of a processing device which would be caused by contact between the film and a substrate transport device. Such a film removal processing has generally been carried out by supplying an etching liquid only to a to-be-removed region of a substrate to effect removal of a film only in the to-be-removed region.

Components in various types of equipment have recently become finer and have required higher accuracy. As sub-micro manufacturing technology has commonly been used, the properties of materials are largely influenced by the processing method. Under these circumstances, in such a conventional machining method that a desired portion in a workpiece is physically destroyed and removed from the surface thereof by a tool, a large number of defects may be produced to deteriorate the properties of the workpiece. Therefore, it becomes important to perform processing without deteriorating the properties of the materials.

Some processing methods, such as chemical polishing, electrolytic processing, and electrolytic polishing, have been developed in order to solve this problem. In contrast with the conventional physical processing, these methods perform removal processing or the like through chemical dissolution reaction. Therefore, these methods do not suffer from defects, such as formation of an altered layer and dislocation, due to plastic deformation, so that processing can be performed without deteriorating the properties of the materials.

When removing a conductive material, such as copper, by e.g. a common etching processing technique conventionally employed, a chemical liquid, selected from a variety of kinds, is used. This requires an adequate post-cleaning and, in addition, imposes a considerable load upon waste liquid treatment. Also in this connection, it is to be pointed out that though a low-k material, which has a low dielectric constant, is expected to be predominantly used in the future as a material for the insulating film of a semiconductor substrate, the low-k material has a low mechanical strength and therefore is hard to endure the stress applied during CMP processing.

Further, with such an etching processing (film-removing processing), control of an etching width and of an edge configuration cannot be made with ease. In addition, with the progress towards multi-layered interconnects, there is the problem of an increased number of process steps becoming necessary.

A method has been reported which performs CMP processing simultaneously with plating, viz. chemical mechanical electrolytic polishing. According to this method, the mechanical processing is carried out to the growing surface of a plating film, causing the problem of denaturing of the resulting film.

In the case of the above-mentioned conventional electrolytic processing or electrolytic polishing, the process proceeds through an electrochemical interaction between a workpiece and an electrolytic solution (aqueous solution of NaCl, NaNO$_3$, HF, HCl, HNO$_3$, NaOH, etc.). Since an electrolytic solution containing such an electrolyte must be used, contamination of a workpiece with the electrolyte cannot be avoided.

SUMMARY OF THE INVENTION

The present invention has been made in view of the above situation in the related art. It is therefore a first object of the present invention to provide a substrate processing apparatus and method that can perform an electrolytic processing through an electrochemical action, which is different from a common, conventional etching, to remove (clean off) a conductive material (film) formed on or adhering to a bevel portion, etc. of a substrate.

It is a second object of the present invention to provide a substrate processing apparatus and method that can simplify removal of a film in a peripheral portion of a substrate and can securely remove the film.

In order to achieve the above objects, the present invention provides a substrate processing apparatus comprising: an electrode section having a plurality of electrodes which are laminated with insulators being interposed, and having a holding portion which is to be opposed to a peripheral portion of a substrate; a liquid supply section for supplying a liquid to the holding position of the electrode section; and a power source for applying a voltage to the electrodes of the electrode section so that the electrodes alternately have different polarities.

An ion exchanger may be disposed in the holding portion of the electrode section.

FIG. 1 illustrates the principle of electrolytic processing effected in the above electrolytic processing apparatus. FIG. 1 shows the ionic state in the electrolytic processing apparatus when an ion exchanger 12a mounted on a processing electrode 14 (e.g. cathode) and an ion exchanger 12b mounted on a feeding electrode 16 (e.g. anode) are brought into contact with or close to a surface of a workpiece (substrate) 10, while a voltage is applied via a power source 17 between the processing electrode 14 and the feeding electrode 16, and a liquid 18, e.g. ultrapure water, is supplied from a liquid supply section 19 between the processing electrode 14, the feeding electrode 16 and the workpiece 10.

When a liquid like ultrapure water that in itself has a large resistivity is used, it is preferred to bring the ion exchanger 12a into contact with the surface of the workpiece 10. This can lower the electric resistance, lower the requisite voltage and reduce the power consumption. The "contact" in the present electrolytic processing does not imply "press" for giving a physical energy (stress) to a workpiece as in CMP.

Water molecules 20 in the liquid 18 such as ultrapure water are dissociated using the ion exchangers 12a, 12b into hydroxide ions 22 and hydrogen ions 24 effectively. The hydroxide ions 22 thus produced, for example, are carried, by the electric field between the workpiece 10 and the processing electrode 14 and by the flow of the liquid 18, to the surface of the workpiece 10 opposite to the processing electrode 14 whereby the density of the hydroxide ions 22 in the vicinity of the workpiece 10 is enhanced, and the hydroxide ions 22 react with the atoms 10a of the workpiece 10. The reaction product 26 produced by this reaction is removed from the workpiece 10 by the flow of the liquid 18 along the surface of the workpiece 10. Removal processing of the surface of the workpiece 10 is thus effected.

As will be appreciated from the above, the removal processing according to the present invention is effected purely by the electrochemical interaction between the reactant ions and the workpiece. The present electrolytic processing thus clearly differs in the processing principle from CMP according to which processing is effected by the combination of the physical interaction between an abrasive and a workpiece, and the chemical interaction between a chemical species in a polishing liquid and the workpiece.

The ion exchanger may be a laminate of a plurality of ion-exchange materials.

By making the ion exchanger a multi-layer structure consisting of laminated layers of ion-exchange materials, such as ion-exchange fibers and an ion-exchange membrane, it is possible to increase the total ion exchange capacity whereby formation of an oxide, for example in removal (polishing) processing of copper, can be restrained to thereby avoid the oxide adversely affecting the processing rate. Further, by using a soft ion-exchange material, such as a porous membrane or a woven fabric, for the outermost layer of a multi-layer ion exchanger, the occurrence of an abnormal processing, such as rise-up or pealing of a copper film after processing, can be suppressed.

The ion exchanger may have water-absorbing properties. This allows a liquid such as ultrapure water to flow within the ion exchanger.

The ion exchanger may have one or both of an anion-exchange ability and a cation-exchange ability. An ion exchanger having an anion-exchange ability and an ion exchanger having a cation-exchange ability can be used selectively according to a substrate. The use of an ion-exchanger having both of anion-exchange and cation-exchange abilities can broaden the range of processible materials and, in addition, can prevent the formation of impurities due to the polarity.

The liquid may be pure water, a liquid having an electric conductivity (referring herein to that at 25° C., 1 atm) of not more than 500 μS/cm, or an electrolytic solution.

Pure water is a water having an electric conductivity of not more than 10 μS/cm. The use of pure water in electrolytic processing enables a clean processing without leaving impurities on the processed surface of a workpiece, whereby a cleaning step after the electrolytic processing can be simplified. Specifically, one or two-stages of cleaning may suffice after the electrolytic processing.

It is also possible to use a liquid obtained by adding an additive, such as a surfactant, to pure water or ultrapure water, and having an electric conductivity of not more than 500 μS/cm, preferably not more than 50 μS/cm, more preferably not more than 0.1 μS/cm (resistivity of not less than 10 MΩ·cm). Such a low electric conductive liquid can form a layer, which functions to inhibit ion migration evenly, at the interface between a workpiece (e.g. substrate) and an ion exchanger, thereby moderating concentration of ion exchange (metal dissolution) to enhance the flatness of the processed surface.

The additive plays a role to prevent local concentration of ions (e.g. hydroxide ions (OH$^-$)). It is noted in this regard that "an equal processing (removal) rate at various points over the entire processing surface" is an important factor for providing a flat processed surface. When a single electrochemical removal reaction is in progress, a local difference in the processing removal rate may be produced by a local concentration of reactant ions. The local concentration of reactant ions may be caused mainly by a deviation in the electric field intensity between the processing electrode and the feeding electrode, and a deviation in the distribution of reactant ions in the vicinity of the surface of a workpiece. The local concentration of reactant ions can be prevented by allowing the additive, which plays a role to prevent local concentration of ions (e.g. hydroxide ions), to exist between a workpiece and an ion exchanger.

An aqueous solution of a neutral salt such as NaCl or $Na_2SO_4$, an acid such as HCl or $H_2SO_4$, or an alkali such as ammonia may be used as the electrolytic solution, and may be properly selected according to the properties of a workpiece. When using electrolytic solution, it is better to use the low concentration electrolytic solution which electric conductivity is not more than 500 µS/cm, to avoid much contamination.

Ultrapure water is preferably used as the liquid. By "ultrapure water" is herein meant a water having an electric conductivity of not more than 0.1 µS/cm. The use of ultrapure water enables a cleaner processing without leaving impurities on the processed surface of a workpiece.

The electrode section may be disposed in a tilted state relative to a horizontal plane so that the substrate can roll over the ion exchanger disposed in the holding portion of the electrode section and move along the electrode section.

The present invention also provides a substrate processing method comprising: opposing a peripheral portion of a substrate to a holding portion provided in an electrode section having a plurality of electrodes which are laminated with insulators being interposed; supplying a liquid to the holding portion of the electrode section; and applying a voltage to the electrodes of the electrode section so that the electrodes alternately have different polarities.

An ion exchanger may be disposed in the holding portion of the electrode section.

The present invention also provides another substrate processing apparatus for processing a substrate, comprising: a processing tool facing across a first film and a second film for removing the first film and the second film simultaneously from an entire surface of a substrate, wherein the first film is formed on the surface of the substrate, and the second film is formed on the first film so as to form a step between a peripheral portion and an effective device portion of the substrate by the first film and the second film. The predetermined thickness may be at least the thickness of the film 7 in the peripheral portion 532 (see FIGS. 7A and 7B).

The substrate processing apparatus can perform in a simple manner an effective removal processing of a substrate W, for example, a substrate W as shown in FIGS. 7A and 7B, in which a film is formed in the substrate surface WA such that the film has a step between the peripheral portion 532 and the effective device portion 533 of the substrate, thereby removing the film 6, 7 in the substrate surface WA by a predetermined thickness t over the entire surface simultaneously, and completely removing the film 7 in the peripheral portion 532 while leaving the film 6 in the effective device portion 533. Preferably, the substrate processing apparatus can remove the film 6, 7 in the substrate surface WA simultaneously over the entire surface by a predetermined uniform thickness.

The substrate processing apparatus may comprise an electrolytic processing apparatus. Such a substrate processing apparatus, because of an electrolytic processing apparatus, can produce a high-quality substrate having a high flatness without defects in the substrate surface, such as a denatured layer and transformation, caused by plastic deformation.

According to one embodiment, as shown in FIG. 9, the substrate processing apparatus as an electrolytic processing apparatus comprises: a processing electrode 218 brought into contact with or close to a substrate W; a feeding electrode 236 for feeding electricity to the substrate W; an ion exchanger 235 disposed in at least one of the space between the substrate W and the processing electrode 218, and the space between the substrate W and the feeding electrode 236; a fluid supply section 229, 217, 219, 220, 228 for supplying a fluid 202 between the substrate W and the ion exchanger 235; and a power source 223 for applying a voltage between the processing electrode 218 and the feeding electrode 236.

According to this substrate processing apparatus, with the provision of the processing electrode 218, the feeding electrode 236, the ion exchanger 235 and the power source 223, electrolytic processing of a substrate W proceeds through the electrochemical action described below.

When the fluid 202 is a liquid, for example pure water, water is dissociated into hydroxide ions and hydrogen ions by the application of a voltage between the processing electrode 218 and the feeding electrode 236. The dissociation of water is promoted by the ion exchanger 235. By the electric field between the substrate W and the processing electrode 218, and by the flow of pure water 202 supplied between the substrate W and the ion exchanger 235, the hydroxide ions produced by the water dissociation are moved to the surface WA, facing the processing electrode 218, of the substrate W. The density of hydroxide ions thus increases in the vicinity of the substrate surface WA, whereby reaction between the atoms of the surface WA and hydroxide ions occurs. The reaction product of this reaction dissolves in pure water 202 and is removed from the substrate W, while some of the product accumulates in the ion exchanger 235. Removal processing of the surface WA of the substrate W is thus effected. Since the surface WA facing the processing electrode 218 is processed, by moving the processing electrode 218 along the surface WA of the substrate W, the surface WA can be removed by a desired thickness or processed into a desired surface configuration.

The ion exchanger may be of a single-layer structure or of a multi-layer laminated structure. The use of a multi-layer laminated structure makes it possible to use a thin membrane as one ion exchanger and increases the total ion exchange capacity. The kinds or properties of ion exchangers may be varied for every layer. For example, the hardness may be varied for every layer.

The power source may apply a predetermined voltage or a controlled voltage that allows a constant electric current to flow. This facilitates control of the processing amount (processing thickness) or the end point of processing. Typically, the object to be processed is a film formed in the substrate surface WA.

According to another embodiment, as shown in FIG. 6, the substrate processing apparatus as an electrolytic processing apparatus comprises: a processing electrode 518 brought into contact with or close to a substrate W; a feeding electrode for feeding electricity to the substrate W; a fluid supply section 529, 517, 519, 520, 528 for supplying a fluid 502 to at least one of the space between the substrate W and the processing electrode 518, and the space between the substrate W and the feeding electrode; and a power source 523 for applying a voltage between the processing electrode 518 and the feeding electrode (substrate W, connected to the power source 523).

According to this substrate processing apparatus, with the provision of the processing electrode 518, the feeding electrode (substrate W) and the power source 523, electrolytic processing of a substrate W proceeds through the electrochemical action as described below.

When the fluid 502 is a liquid, for example pure water, water is dissociated into hydroxide ions and hydrogen ions by the application of a voltage between the processing electrode 518 and the feeding electrode (substrate W). By the electric field between the substrate W and the processing electrode 518 and by the flow of pure water 502 supplied between the substrate W and the processing electrode 518 and/or between the substrate W and the feeding electrode, the hydroxide ions produced by the water dissociation are moved to the surface WA, facing the processing electrode 518, of the substrate W. The density of hydroxide ions thus increases in the vicinity of the substrate surface WA, whereby reaction between the atoms of the surface WA and hydroxide ions occurs. The reaction product of this reaction dissolves in pure water 502 and is removed from the substrate W. Removal processing of the surface WA of the substrate W is thus effected. Since the surface WA facing the processing electrode 518 is processed, by relatively moving the processing electrode 518 along the surface WA of the substrate W, the surface WA can be removed by a desired thickness or processed into a desired surface configuration.

In the substrate processing apparatus of the present invention, for example the substrate processing apparatus shown in FIG. 9, the use of an electrolysis solution as a fluid 202 can enhance the processing rate. When a liquid having an electric conductivity of not more than 500 μS/cm is used as the fluid 202, through the processing rate may be lowered as compared to the use of an electrolysis solution, processing can be performed with the liquid containing less impurity. The use of pure water enables a cleaner processing. Even when using pure water or a liquid having an electric conductivity of not more than 500 μS/cm, the processing rate can be maintained at a high level by the provision of the ion exchanger 235.

According to still another embodiment of the present invention, as shown in FIG. 8, the substrate processing apparatus as an electrolytic processing apparatus comprises: a processing electrode 118 brought into contact with or close to a substrate W; a feeding electrode (substrate W, connected to the power source 123) for feeding electricity to the substrate W; a fluid supply section for supplying a fluid 102 which is pure water or a liquid having an electric conductivity of not more than 500 μS/cm; a power source 123 for applying a voltage between the processing electrode 118 and the feeding electrode (substrate W); and an ion exchanger 135.

According to this substrate processing apparatus, with the provision of the processing electrode 118, the feeding electrode (substrate W), the ion exchanger 135 and the power source 123, electrolytic processing of a substrate W proceeds through the electrochemical action described below.

Water is dissociated into hydroxide ions and hydrogen ions by the application of a voltage between the processing electrode 118 and the feeding electrode (substrate W). The dissociation of water is promoted by the ion exchanger 135. By the electric field between the substrate W and the processing electrode 118 and by the flow of pure water 102 or the liquid 102 supplied, the hydroxide ions produced by the water dissociation are moved to the surface WA, facing the processing electrode 118, of the substrate W. The density of hydroxide ions thus increases in the vicinity of the substrate surface WA, whereby reaction between the atoms of the surface WA and hydroxide ions occurs. The reaction product of this reaction dissolves in pure water 102 or in the liquid 102 and is removed from the substrate W, while some of the product accumulates in the ion exchanger 135. Removal processing of the surface WA of the substrate W is thus effected. Since the surface WA facing the processing electrode 118 is processed, by moving the processing electrode 118 along the surface WA of the substrate W, the surface WA can be removed by a desired thickness or processed into a desired surface configuration.

The substrate processing apparatus may comprise a chemical etching apparatus. Such a substrate processing apparatus, because of a chemical etching apparatus, can produce a high-quality substrate having a high flatness without defects in the substrate surface, such as a denatured layer and transformation, caused by plastic deformation.

The present invention also provides a substrate processing method as illustrated in FIGS. 7A and 7B, comprising: forming a film 6, 7 on a substrate W such that the film has a step between the peripheral portion 532 and the effective device portion 533 of the substrate W; and removing the film 6, 7 in the substrate surface WA by a predetermined thickness over the entire surface simultaneously.

The step of forming the film such that the film has a step between the peripheral portion 532 and the effective device portion 533 typically consists of: a first stage of forming a first film 7 over the entire substrate surface WA; and a second stage of forming a second film 6 in the effective device portion 533 of the substrate. The step of removing the film 6, 7 in the substrate surface WA by a predetermined thickness over the entire surface simultaneously may be carried out in such a manner that the film 6, 7 in the substrate surface WA is processed at a uniform processing rate over the entire surface WA until the first film 7 in the peripheral portion 532 is completely removed. The processing may be terminated at the time when the film 7 is completely removed. Since the film has a step between the peripheral portion 532 and the effective device portion 533, even when the first film 7 in the peripheral portion 532 is completely removed, the second film 6 in the effective device portion 533 still remains. The film 7 in the peripheral portion 532 can thus be selectively removed. The processing may be either by electrolytic processing or by chemical etching processing.

According to a preferred embodiment, the substrate processing method as an electrolytic processing method comprises: forming a first film on the surface of a substrate, and a second film on the first film so as to form a step between a peripheral portion and an effective device portion of the substrate by the first film and the second film; bringing a processing electrode close to a substrate while feeding electricity from a feeding electrode to the substrate; disposing an ion exchanger in at least one of the space between the substrate and the processing electrode, and the space between the substrate and the feeding electrode; supplying a fluid between the substrate and the ion exchanger; and applying a voltage between the processing electrode and the feeding electrode so as to remove the first film and the second film simultaneously from the entire surface of the substrate by a predetermined thickness.

The above and other objects, features, and advantages of the present invention will be apparent from the following description when taken in conjunction with the accompanying drawings which illustrate preferred embodiments of the present invention by way of example.

DETAILED DESCRIPTION OF THE INVENTION

Preferred embodiments of the present invention will now be described in detail with reference to the drawings. Though the below-described embodiments refer to substrate processing apparatuses which use a substrate as a workpiece to be processed and remove (polish) copper formed on or adhering to a peripheral portion (bevel portion or edge portion) of the substrate, the present invention is of course applicable to processing apparatuses which process a workpiece other than a substrate.

Figure 1:
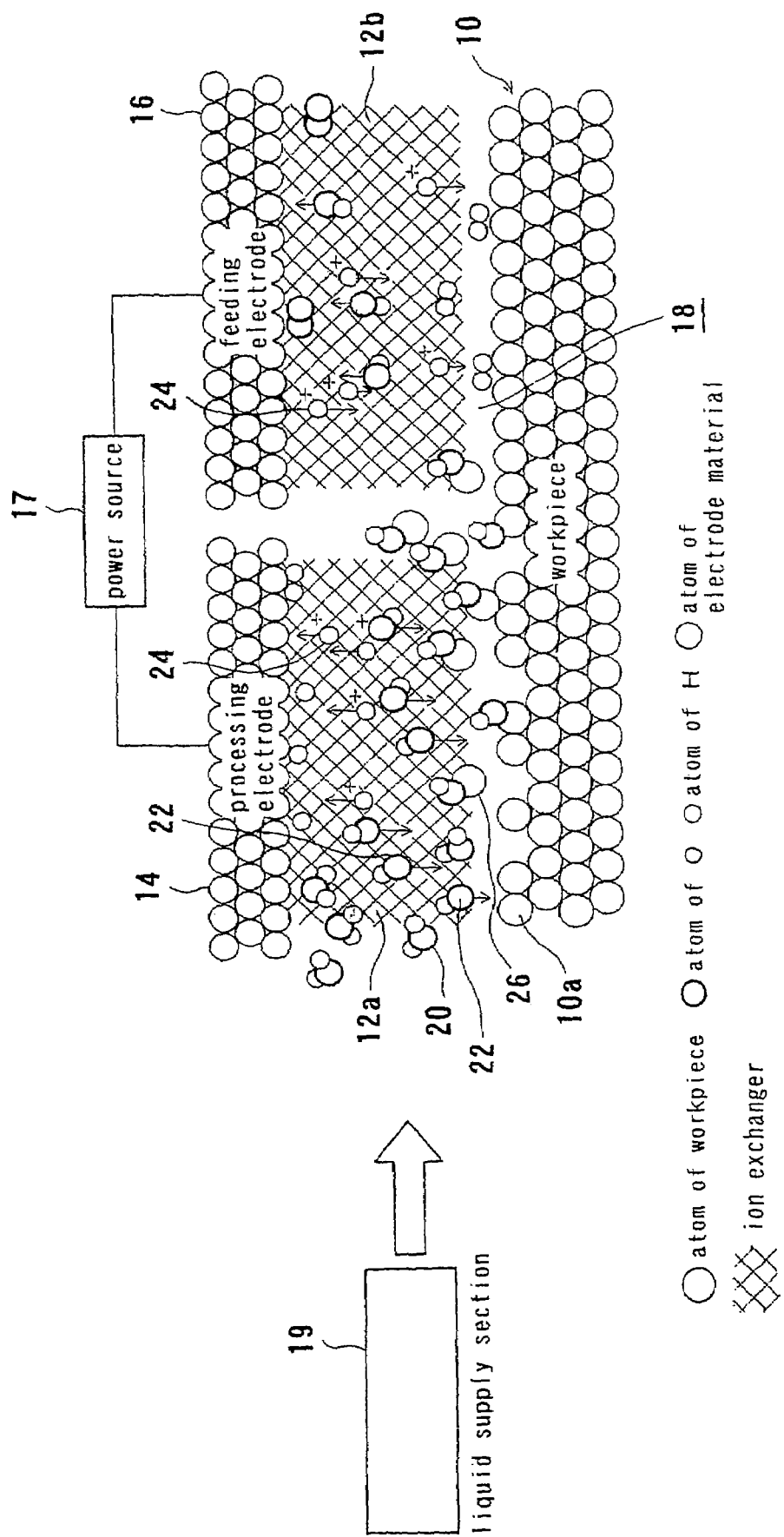
FIG. 1 is a diagram illustrating the principle of electrolytic processing according to the present invention.
Figure 2:
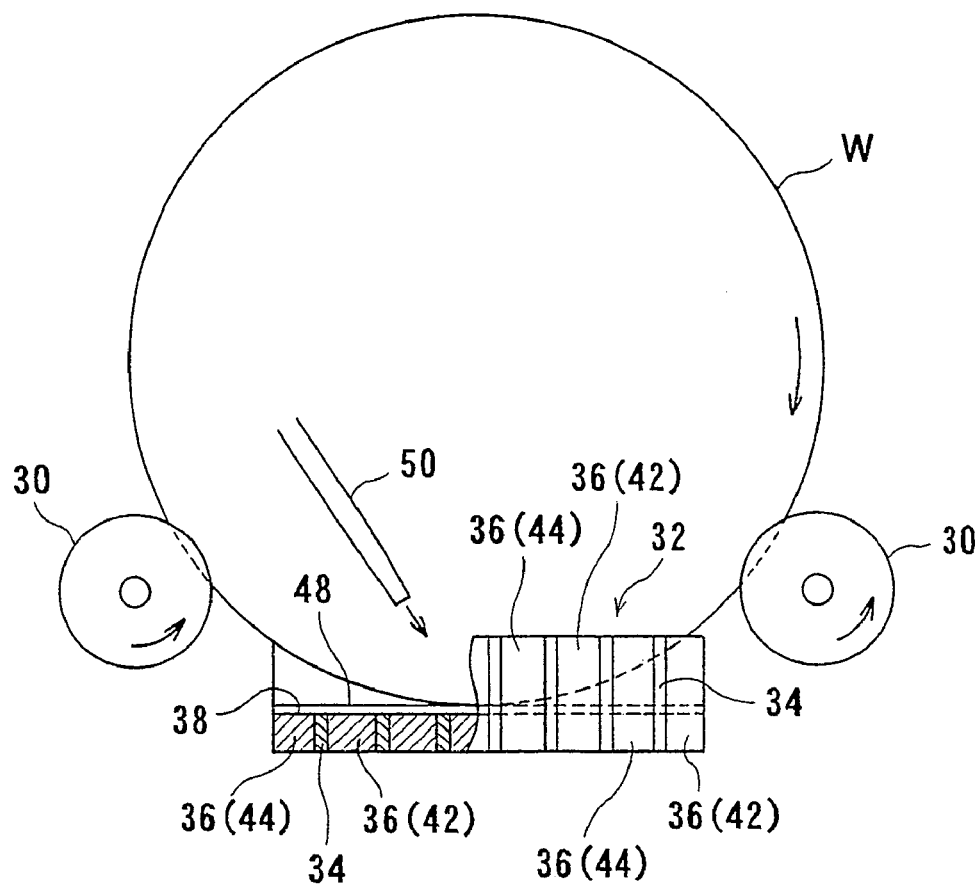
FIG. 2 is a schematic view of an electrolytic processing apparatus (substrate processing apparatus) of one embodiment of the present invention, which is utilized as a bevel-removal apparatus.
Figure 3:
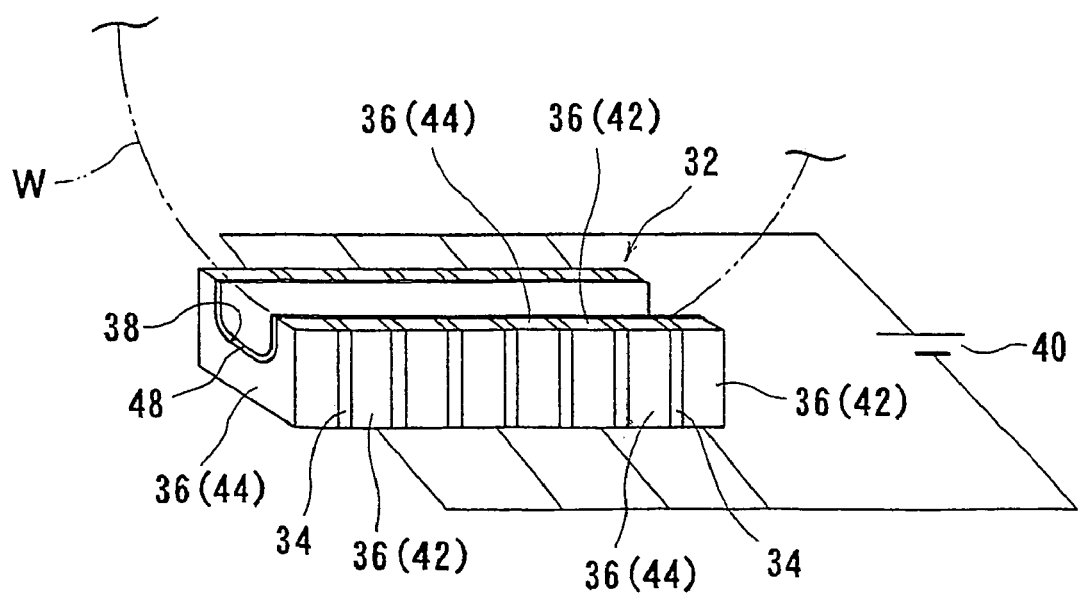
FIG. 3 is a perspective view of the electrode section of FIG. 2.
Figure 4:
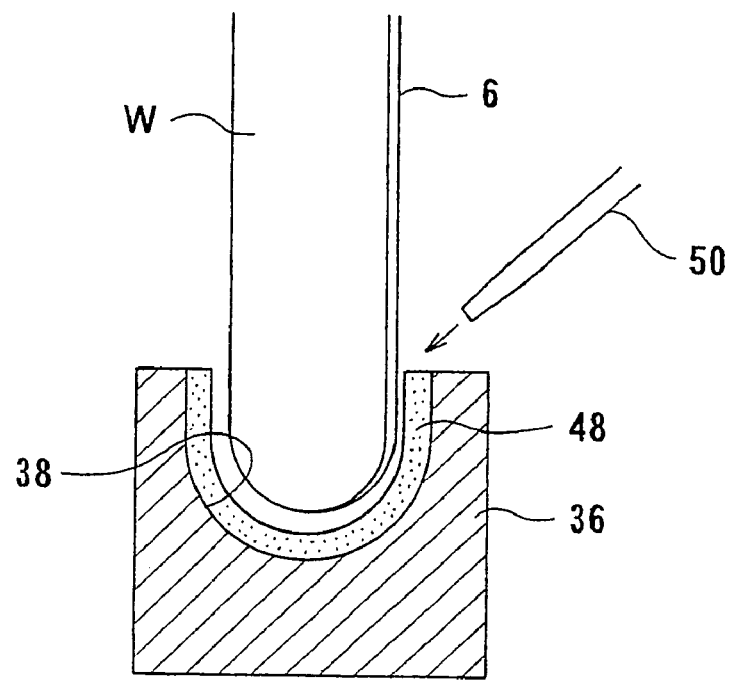
FIG. 4 is an enlarged sectional view of the electrode of the electrode section of FIG. 2.

FIGS. 2 through 4 show an electrolytic processing apparatus (substrate processing apparatus) according to an embodiment of the present invention, which is utilized as a bevel-removal apparatus. The bevel-removal apparatus (electrolytic processing apparatus) includes a pair of rotatable roller chucks 30 for vertically holding a substrate W, which has been dropped in from above, and an electrode section 32 provided below the roller chucks 30.

The roller chucks 30 each have a V-shaped groove in the circumferential end surface and hold the substrate W by bringing a peripheral portion of the substrate into engagement with the groove. Further, the roller chucks 30 are directly connected to a motor (not shown), and are allowed to rotate synchronously in the same direction by the actuation of the motor, thereby rotating the substrate W.

The electrode section 32 has a plurality of electrodes 36 that are connected in series with insulators 34 being interposed. The cathode and the anode of a power source 40 are alternately connected to the electrodes 36. According to this embodiment, the electrodes 36 connected to the cathode of the power source 40 become processing electrodes 42, and the electrodes 36 connected to the anode of the power source 40 become feeding electrodes 44. This applies to processing of e.g. copper, because electrolytic processing of copper proceeds on the cathode side. Depending upon a material to be processed, the cathode side can be a feeding electrode and the anode side can be a processing electrode. More specifically, when the material to be processed is copper, molybdenum, iron or the like, electrolytic processing proceeds on the cathode side, and therefore the electrodes 36 connected to the cathode of the power source 40 should be the processing electrodes 42 and the electrodes 36 connected to the anode of the power source 40 should be the feeding electrodes 44. In the case of aluminum, silicon or the like, on the other hand, electrolytic processing proceeds on the anode side. Accordingly, the electrodes connected to the anode of the power source should be the processing electrodes and the electrodes connected to the cathode should be the feeding electrodes.

Further, in the upper surface of the electrode section 32, there is provided a groove 38 as a holding portion, which extends linearly over the full length in the longitudinal direction of the electrode section 32, and which may have a U-shape section in conformity with the sectional configuration of the periphery of the substrate W. The entire surface of the groove (holding portion) 38 is covered with an ion exchanger 48 that is bent in the U-shape conforming to the surface of the groove 38.

The electrode section 32 is located in such a position that when the substrate W is held by the roller chucks 30, the lowermost surface of the substrate W is close to or in slight contact with the surface of the ion exchanger 48 disposed in the groove 38 of the electrode section 32. The groove 38 extends in such a direction that the substrate W transverses the lamination of electrodes 36.

Though this embodiment shows the provision in the electrode section 32 of the groove 38 which extends linearly across the insulators 34 and the electrodes 36, it is also possible to provide a groove which extends in an arc in conformity with the peripheral shape of the substrate W, so that the ion exchanger disposed in the groove can be closed to or in slight contact with the peripheral end surface of the substrate W over the full length in the longitudinal direction of the ion exchanger.

The "bevel portion" of a substrate (e.g. semiconductor wafer) generally refers to a several mm-width region from the peripheral end of the substrate. When carrying out removing of a conductive film in such a portion, the portion needs to be "in a covered state". To meet this requirement, the groove 38 as a holding portion is provided in the electrode section 32, according to this embodiment. As an alternative, it is possible to form a groove by disposing two flat plates so that they face each other. It is also possible to make an electrode portion of a flat plate, and press the end of a substrate (e.g. substrate wafer) against the electrode portion by utilizing elasticity of an ion exchanger mounted on the flat plate-shaped electrode section.

The ion exchanger 48 may be a nonwoven fabric which has an anion-exchange ability or a cation-exchange ability. A cation exchanger preferably carries a strongly acidic cation-exchange group (e.g. sulfonic acid group); however, a cation exchanger carrying a weakly acidic cation-exchange group (e.g. carboxyl group) may also be used. Though an anion exchanger preferably carries a strongly basic anion-exchange group (e.g. quaternary ammonium group), an anion exchanger carrying a weakly basic anion-exchange group (e.g. tertiary or lower amino group) may also be used.

The nonwoven fabric carrying a strongly basic anion-exchange group can be prepared by, for example, the following method: A polyolefin nonwoven fabric having a fiber diameter of 20–50 µm and a porosity of about 90% is subjected to the so-called radiation graft polymerization, comprising γ-ray irradiation onto the nonwoven fabric and the subsequent graft polymerization, thereby introducing graft chains; and the graft chains thus introduced are then aminated to introduce quaternary ammonium groups thereinto. The capacity of the ion-exchange groups introduced can be determined by the amount of the graft chains introduced. The graft polymerization may be conducted by the use of a monomer such as acrylic acid, styrene, glicidyl methacrylate, sodium styrenesulfonate or chloromethylstyrene. The amount of the graft chains can be controlled by adjusting the monomer concentration, the reaction temperature and the reaction time. Thus, the degree of grafting, i.e. the ratio of the weight of the nonwoven fabric after graft polymerization to the weight of the nonwoven fabric before graft polymerization, can be made 500% at its maximum. Consequently, the capacity of the ion-exchange groups introduced after graft polymerization can be made 5 meq/g at its maximum.

The nonwoven fabric carrying a strongly acidic cation-exchange group can be prepared by the following method. As in the case of the nonwoven fabric carrying a strongly basic anion-exchange group, a polyolefin nonwoven fabric having a fiber diameter of 20–50 µm and a porosity of about 90% is subjected to the so-called radiation graft polymerization comprising γ-ray irradiation onto the nonwoven fabric and the subsequent graft polymerization, thereby introducing graft chains; and the graft chains thus introduced are then treated with a heated sulfuric acid to introduce sulfonic acid groups thereinto. If the graft chains are treated with a heated phosphoric acid, phosphate groups can be introduced. The degree of grafting can reach 500% at its maximum, and the capacity of the ion-exchange groups thus introduced after graft polymerization can reach 5 meq/g at its maximum.

The base material of the ion-exchanger 48 may be a polyolefin such as polyethylene or polypropylene, or any other organic polymer. Further, besides the form of a nonwoven fabric, the ion-exchanger may be in the form of a woven fabric, a sheet, a porous material, short fibers, etc.

When polyethylene or polypropylene is used as the base material, graft polymerization can be effected by first irradiating radioactive rays (γ-rays or electron beam) on to the base material (pre-irradiation) to thereby generate a radical, and then reacting the radical with a monomer, whereby uniform graft chains with few impurities can be obtained. When an organic polymer other than polyolefin is used as the base material, on the other hand, radical polymerization can be effected by impregnating the base material with a monomer and irradiating radioactive rays (γ-rays, electron beam or UV-rays) onto the base material (simultaneous irradiation). Though this method fails to provide uniform graft chains, it is applicable to a wide variety of base materials.

By using as the ion exchanger 48 a nonwoven fabric having an anion-exchange ability or a cation-exchange ability, it becomes possible that pure water or ultrapure water, or a liquid such as an electrolytic solution can freely move within the nonwoven fabric and easily arrive at the active points in the nonwoven fabric having a catalytic activity for water dissociation, so that many water molecules are dissociated into hydrogen ions and hydroxide ions. Further, by the movement of pure water or ultrapure water, or a liquid such as an electrolytic solution, the hydroxide ions produced by the water dissociation can be efficiently carried to the surface of the processing electrode 42, whereby a high electric current can be obtained even with a low voltage applied.

When the ion exchanger 48 has only one of anion-exchange ability and cation-exchange ability, a limitation is imposed on electrolytically processible materials and, in addition, impurities are likely to form due to the polarity. In order to solve this problem, the ion exchanger 48 may have such a structure wherein anion-exchangers having an anion-exchange ability and cation-exchangers having a cation-exchange ability are concentrically disposed to constitute an integral structure. The anion exchangers and the cation exchangers may be superimposed on the surface, to be processed, of a substrate. Alternatively, the above problem can be solved by using, as the ion exchanger 48, an ion-exchanger which in itself carries both of an anion-exchange group and a cation-exchange group. Such an ion exchanger may include an amphoteric ion exchanger in which anion-exchange groups and cation-exchange groups are distributed randomly, a bipolar ion exchanger in which anion-exchange groups and cation-exchange groups are present in layers, and a mosaic ion exchanger in which portions containing anion-exchange groups and portions containing cation-exchange groups are present in parallel in the thickness direction. Incidentally, it is of course possible to selectively use, as the ion exchanger 48, one having an anion-exchange ability or one having a cation-exchange ability according to the material to be processed.

Further, by making the ion exchanger 48 a multi-layer structure consisting of laminated layers of ion-exchange materials, such as a nonwoven fabric, a woven fabric and a porous membrane, it is possible to increase the total ion exchange capacity whereby formation of an oxide, for example in removal (polishing) processing of copper, can be restrained to thereby avoid the oxide adversely affecting the processing rate. In this regard, when the total ion exchange capacity of an ion exchanger is smaller than the amount of copper ions taken in the ion exchanger during removal processing, the oxide should inevitably be formed on the surface or the inside of the ion exchanger, which adversely affects the processing rate. Thus, the formation of the oxide is governed by the ion exchange capacity of an ion exchanger, and copper ions exceeding the capacity should become the oxide. The formation of an oxide can thus be effectively restrained by using, as the ion exchanger 48, a multi-layer ion exchanger composed of laminated layers of ion-exchange materials which has enhanced total ion exchange capacity. In using any of the above-described ion exchangers, the formation of an oxide can also be restrained and the processing rate can be stabilized by regenerating the ion exchanger, by means of an ion exchanger regeneration mechanism for discharging process products accumulated within an ion exchanger, so as to suppress accumulation of copper ions within the ion exchanger.

It is also possible to make the ion exchanger 48 a multi-layer structure with the topmost layer being composed of a soft ion exchanger (ion exchange material) such as a porous membrane or a woven fabric, or to cover the surface of the ion exchanger 48 with a water-absorbing pad. This can avoid direct contact between the ion exchanger 48 and a to-be-processed material, thereby suppressing production of fiber dust due to friction between the ion exchanger 48 and the to-be-processed material and prolonging the mechanical life of the ion exchanger 48 itself.

Located above the electrode section 32, there is provided a pure water nozzle 50 as a pure water supply section, extending toward almost the center in the long direction of the groove 38, for supplying pure water or ultrapure water. The pure water nozzle 50 supplies pure water or ultrapure water into the groove 38 of the electrode section 32 to fill the groove 38 with pure water or ultrapure water, and the pure water or ultrapure water is discharged successively. Pure water herein refers to water having an electric conductivity of not more than 10 µS/cm, and ultrapure water refers to water having an electric conductivity of not more than 0.1 µS/cm. Instead of pure water, a liquid having an electric conductivity of not more than 500 µS/cm or any electrolytic solution may be used. By supplying such a processing liquid during processing, the instability factors of processing, such as process products and dissolved gases, can be removed, and processing can be effected uniformly with good reproducibility.

With respect to the processing electrode 42 and the feeding electrode 44, oxidation or dissolution thereof due to an electrolytic reaction is generally a problem. In view of this, it is preferred to use, as a base material of the feeding electrode 44, carbon, a noble metal that is relatively inactive, a conductive oxide or a conductive ceramic, rather than a metal or metal compound widely used for electrodes. A noble metal-based electrode may, for example, be one obtained by plating or coating platinum or iridium onto a titanium electrode, and then sintering the coated electrode at a high temperature to stabilize and strengthen the electrode. Ceramics products are generally obtained by heat-treating inorganic raw materials, and ceramics products having various properties are produced from various raw materials including oxides, carbides and nitrides of metals and non-metals. Among them there are ceramics having an electric conductivity. When an electrode is oxidized, the value of the electric resistance generally increases to cause an increase of applied voltage. However, by protecting the surface of an electrode with a non-oxidative material such as platinum or with a conductive oxide such as an iridium oxide, the decrease of electric conductivity due to oxidation of the base material of an electrode can be prevented.

A description will now be given of an example of processing by means of the electrolytic processing apparatus (bevel-removal apparatus).

First, a substrate W, having e.g. a copper film 6 (see FIG. 13B) as a conductor film (to-be-processed portion) formed in the surface, is dropped between the pair of roller chucks 30, 30 to hold the substrate vertically. At this time, the lowermost surface of the substrate W is close to or in slight contact with the surface of the ion exchanger 48.

Next, a given voltage is applied from the power source 40 between the processing electrodes 42 and the feeding electrodes 44, while the substrate W is rotated. At the same time, pure water or ultrapure water is supplied through the pure water nozzle 50 to the inside of the groove 38 so as to fill the groove 38 with pure water or ultrapure water. Thereby, electrolytic processing of the conductor film (copper film 6) formed on the substrate W is effected by hydrogen ions or hydroxide ions produced using the ion exchanger 48. According to the above electrolytic processing apparatus, a large amount of hydrogen ions or hydroxide ions can be produced by allowing pure water or ultrapure water to flow within the ion exchanger 48, and the large amount of such ions can be supplied to the surface of the substrate W, whereby the electrolytic processing can be conducted efficiently.

More specifically, by allowing pure water or ultrapure water to flow within the ion exchanger 48, a sufficient amount of water can be supplied to a functional group (sulfonic acid group in the case of an ion exchanger carrying a strongly acidic cation-exchange group) thereby to increase the amount of dissociated water molecules, and the process product (including a gas) formed by the reaction between the conductor film (copper film 6) and hydroxide ions (or OH radicals) can be removed by the flow of water, whereby the processing efficiency can be enhanced. The flow of pure water or ultrapure water is thus necessary, and the flow of water should desirably be constant and uniform. The constancy and uniformity of the flow of water leads to constancy and uniformity in the supply of ions and the removal of the process product, which in turn leads to constancy and uniformity in the processing.

After completion of the electrolytic processing, the power source 40 is disconnected, the supply of pure water or ultrapure water is stopped, and then the rotation of the substrate W is stopped. Thereafter, the transfer robot takes the processed substrate W, and then transfers the substrate W to the next process.

This embodiment shows the case of supplying pure water, preferably ultrapure water to the ion exchanger 48. The use of pure water or ultrapure water containing no electrolyte upon electrolytic processing can prevent impurities such as an electrolyte from adhering to and remaining on the surface of the substrate W. Further, copper ions or the like dissolved during electrolytic processing are immediately caught by the ion exchanger 48 through the ion-exchange reaction. This can prevent the dissolved copper ions or the like from re-precipitating on the other portions of the substrate W, or from being oxidized to become fine particles which contaminate the surface of the substrate W.

Ultrapure water has a high resistivity, and therefore an electric current is hard to flow therethrough. A lowering of the electric resistance is made by interposing the ion exchanger 48 between the electrodes and a substrate. Further, an electrolytic solution, when used in combination with ultrapure water, can further lower the electric resistance and reduce the power consumption. When electrolytic processing is conducted by using an electrolytic solution, the portion of a workpiece that undergoes processing ranges over a slightly wider area than the area of the processing electrode. In the case of the combined use of ultrapure water and the ion exchanger, on the other hand, since almost no electric current flows through ultrapure water, electric processing is effected only within the area of a workpiece that is equal to the area of the processing electrode and the ion exchanger.

It is possible to use, instead of pure water or ultrapure water, an electrolytic solution obtained by adding an electrolyte to pure water or ultrapure water. The use of such an electrolytic solution can further lower the electric resistance and reduce the power consumption. A solution of a neutral salt such as NaCl or $Na_2SO_4$, a solution of an acid such as HCl or $H_2SO_4$, or a solution of an alkali such as ammonia, may be used as the electrolytic solution, and these solutions may be selectively used according to the properties of the workpiece. When the electrolytic solution is used, it is preferred to provide a slight interspace between the substrate W and the ion exchanger 48 so that they are not in contact with each other. To avoid contamination of the substrate W induced by an electrolytic solution, it is better to use a dilute electrolytic solution which electric conductivity is not more than 500 µs/cm. Therefore, the cleanliness of the processed workpiece can be increased.

Further, it is also possible to use, instead of pure water or ultrapure water, a liquid obtained by adding a surfactant to pure water or ultrapure water, and having an electric conductivity of not more than 500 µS/cm, preferably not more than 50 µS/cm, more preferably not more than 0.1 µS/cm (resistivity of not less than 10 MΩ·cm). Due to the presence of a surfactant, the liquid can form a layer, which functions to inhibit ion migration evenly, at the interface between the substrate W and the ion exchanger 48, thereby moderating concentration of ion exchange (metal dissolution) to enhance the flatness of the processed surface. The surfactant concentration is desirably not more than 100 ppm. When the value of the electric conductivity is too high, the current efficiency is lowered and the processing rate is decreased. The use of the liquid having an electric conductivity of not more than 500 µS/cm, preferably not more than 50 µS/cm, more preferably not more than 0.1 µS/cm, can attain a desired processing rate.

According to the present invention, the processing rate can be considerably enhanced by interposing the ion exchanger 48 between the substrate W and the processing and feeding electrodes 42, 44. In this regard, electrochemical processing using ultrapure water is effected by a chemical interaction between hydroxide ions in ultrapure water and a material to be processed. However, the amount of the hydroxide ions acting as reactant in ultrapure water is as small as $10^{-7}$ mol/L under normal temperature and pressure conditions, so that the removal processing efficiency can decrease due to reactions (such as an oxide film-forming reaction) other than the reaction for removal processing. It is therefore necessary to increase hydroxide ions in order to conduct removal processing efficiently. A method for increasing hydroxide ions is to promote the dissociation reaction of ultrapure water by using a catalytic material, and an ion exchanger can be effectively used as such a catalytic material. More specifically, the activation energy relating to water-molecule dissociation reaction is lowered by the interaction between functional groups in an ion exchanger and water molecules, whereby the dissociation of water is promoted to thereby enhance the processing rate.

Figure 5:
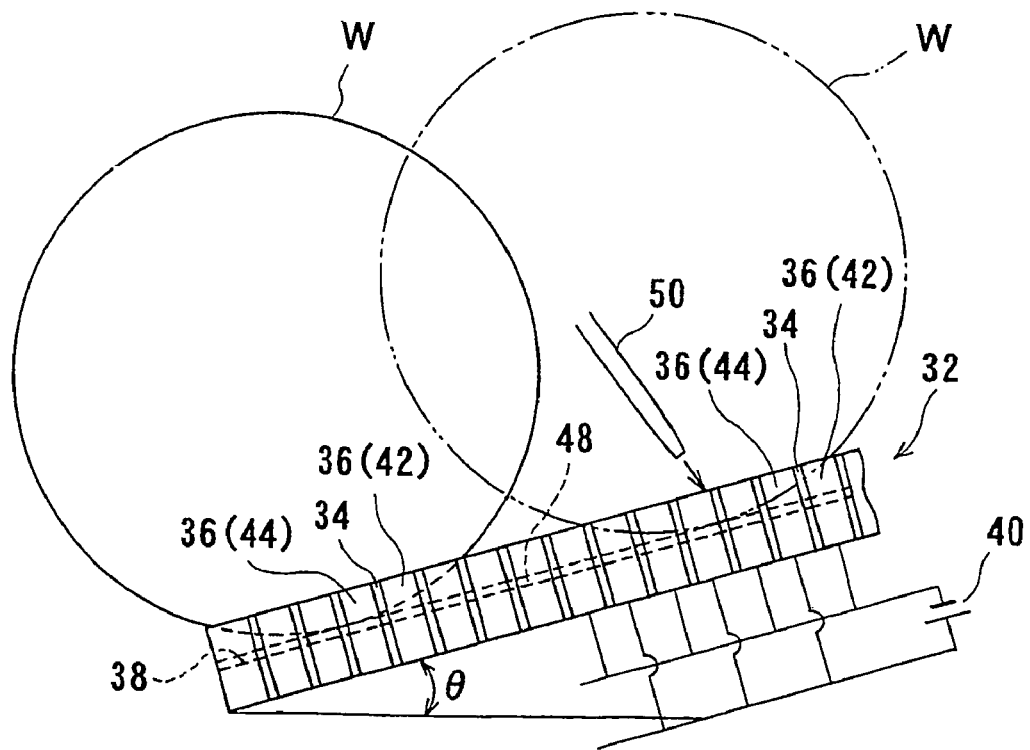
FIG. 5 is a schematic sectional view of an electrolytic processing apparatus (substrate processing apparatus), utilized as a bevel-removal apparatus, according to another embodiment of the present invention.

FIG. 5 shows an electrolytic processing apparatus (substrate processing apparatus), utilized as a bevel-removal apparatus, according to another embodiment of the present invention. The bevel-removal apparatus (electrolytic processing apparatus) of this embodiment employs, as the electrode section 32 having a plurality of electrodes 36, one having a sufficiently larger length than the peripheral length of the substrate W. Further, the electrode section 32 is disposed in a tilted state, e.g. by angle θ relative to a horizontal plane, whereby the substrate W is allowed to roll over the ion exchanger 48 disposed in the groove 38 and move along the electrode section 32. The other construction is the same as the above-described embodiment.

According to this embodiment, the substrate W spontaneously rotates by its own weight, making it possible to omit a mechanism for holding and rotating a substrate, and thus simplify the construction.

According to the bevel-removal apparatuses (substrate processing apparatuses) of the above-described embodiments, electrolytic processing of a workpiece, such as a substrate, can be effected through electrochemical action, without causing any physical defects in the workpiece that would impair the properties of the workpiece. The electrolytic processing can effectively remove (clean off) a conductive material formed on or adhering to a bevel portion, etc. of a substrate or process a peripheral portion of a substrate. Although the apparatuses, as shown in FIGS. 2 through 5, are accompanied with ion exchangers, the process of the present invention is achieved without an ion exchanger, but by using electrolytic solution as a liquid. The processing of a substrate can be effected even by solely using pure water or ultrapure water. This obviates the possibility that impurities such as an electrolyte will adhere to or remain on the surface of the substrate, can simplify a cleaning process after the removal processing, and can remarkably reduce a load upon waste liquid disposal.

Figure 6:
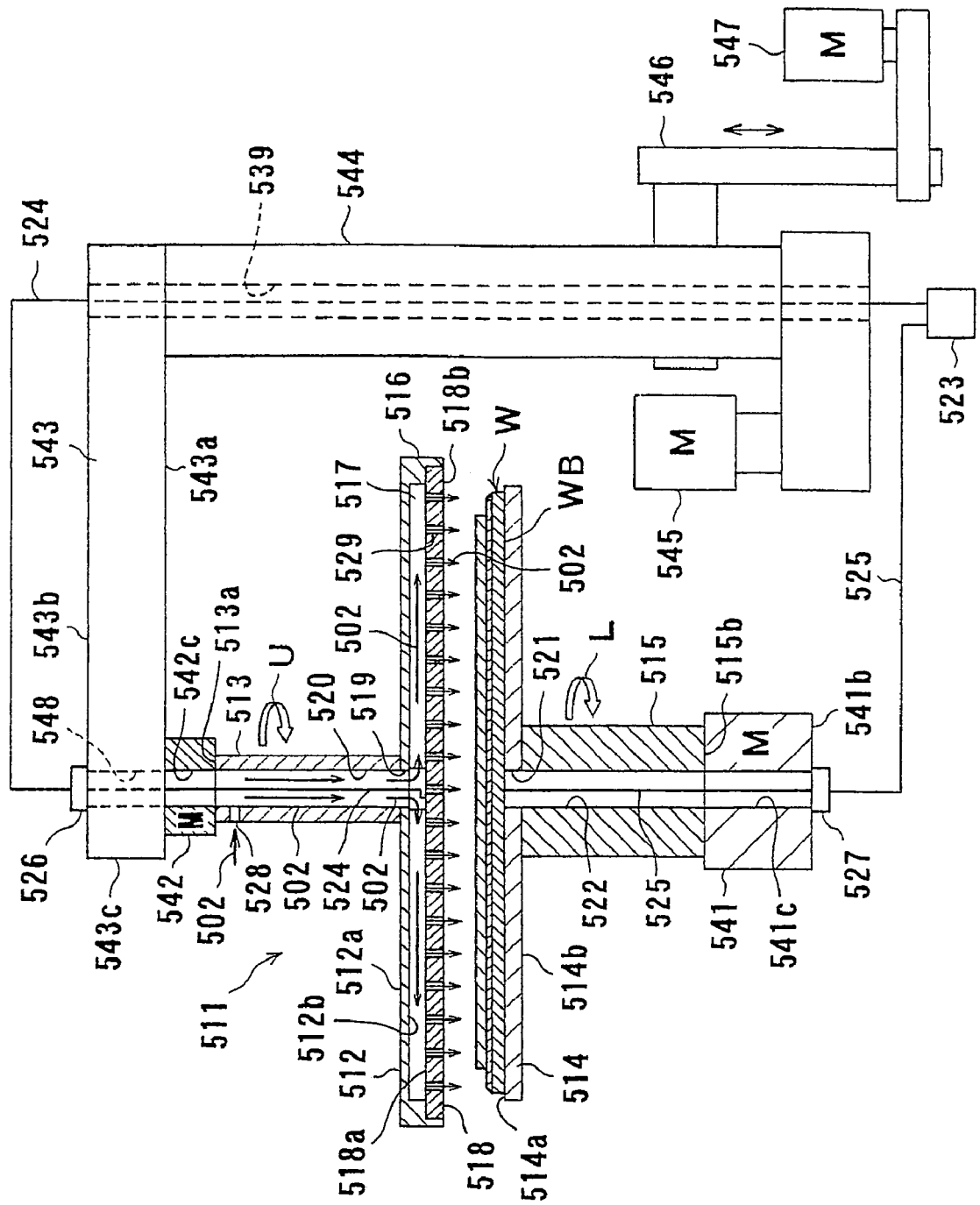
FIG. 6 is a schematic sectional view of an electrolytic processing apparatus (substrate processing apparatus) according to still another embodiment of the present invention.
Figure 13A:
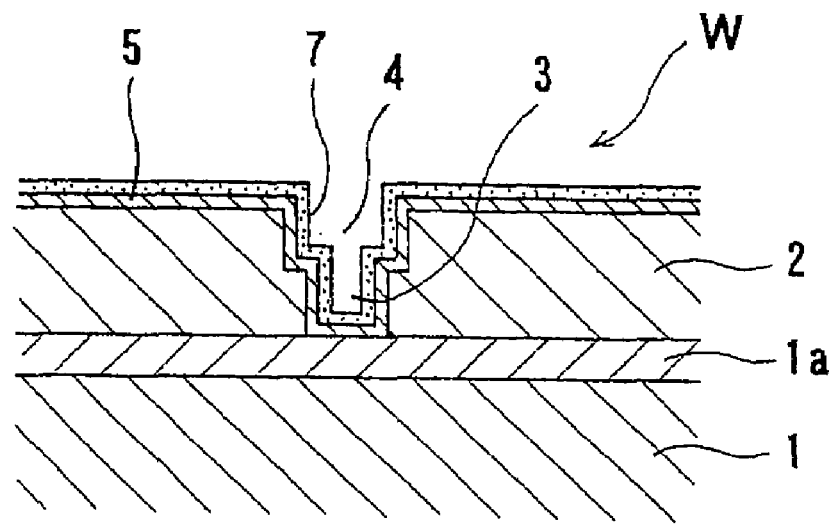
FIGS. 13A through 13C are diagrams illustrating, in sequence of process steps, the formation of copper interconnects.
Figure 13B:
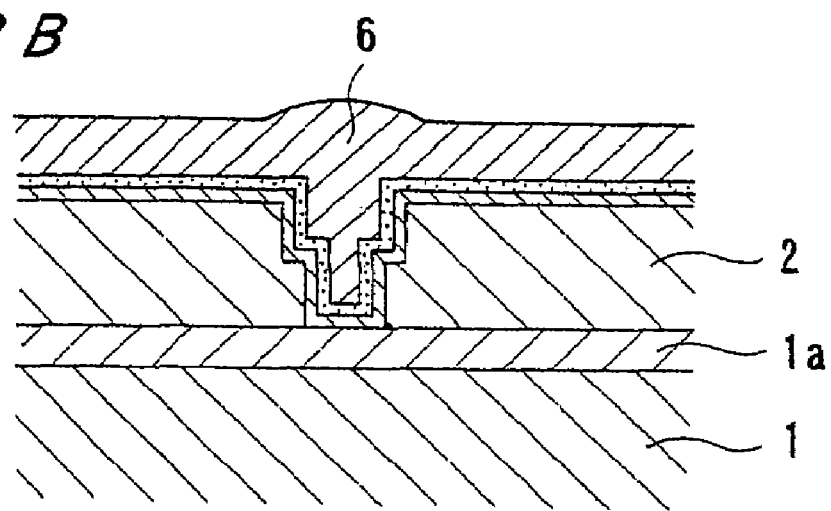
Figure 13C:
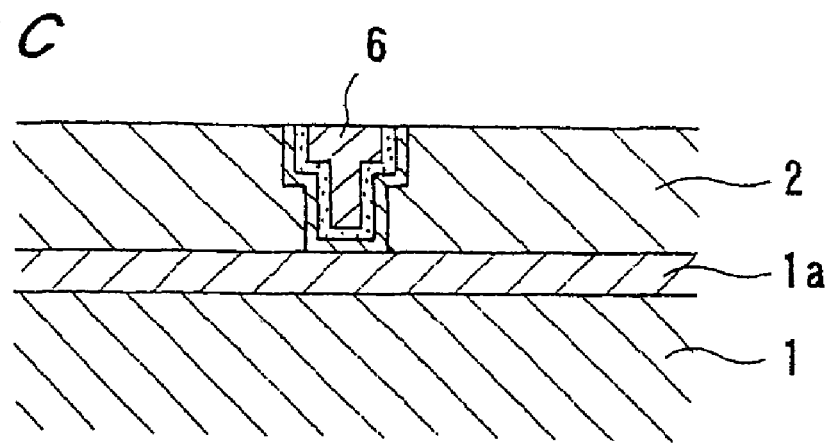

FIG. 6 is a schematic sectional view of an electrolytic processing apparatus 511 as a substrate processing apparatus according to still another embodiment of the present invention. The electrolytic processing apparatus 511 comprises an electrode holding section 512 for holding a processing electrode 518, an electrode-rotating shaft 513 secured to the electrode holding section 512, a substrate holding section 514, provided below the electrode holding section 512, for sucking and holding a substrate W as a workpiece (e.g. a wafer having a copper film 6 as shown in FIG. 13B), and a substrate-rotating shaft 515 secured to the substrate holding section 514. According to this embodiment, the substrate W functions as a feeding electrode, as will be described below. The electrolytic processing apparatus 511 also includes a power source 523 for applying a voltage between the processing electrode 518 and the substrate W. The electrode holding section 512 moves relative to the substrate holding section 514, as will be described later.

The electrolytic processing apparatus 511 is also provided with a hollow motor 541 as a substrate-rotating means for rotating the substrate holding section 514 via the substrate-rotating shaft 515 (rotation about the central axis of the substrate-rotating shaft 515 (rotation L)); a hollow motor 542 as an electrode-rotating means for eccentrically rotating the electrode holding section 512 about a vertical axis via the electrode-rotating shaft 513 (rotation U); a pivot arm 543, a pivot shaft 544 and a pivot motor 545, as an electrode-pivoting means for pivoting the electrode holding section 512 toward a position right above the substrate holding section 514, or pivoting the electrode holding section 512 horizontally from the position right above the substrate holding section 514; a ball screw 546 and a vertical movement motor 547, as a vertical movement means for raising the electrode holding section 512 away from the substrate holding section 514, or lowering it close to the substrate holding section 514; and a processing liquid supply means (not shown) as a fluid supply means for supplying a processing liquid 502 as a fluid. The pivot arm 543 is driven by the pivot motor 545, and pivots the electrode holding section 512. The ball screw 546 is driven by the vertical movement motor 547, and raises and lowers the pivot shaft 544, the pivot arm 543 and the electrode holding section 512.

The electrode holding section 512 has a substantially discoidal shape, and is disposed horizontally. A circumferential wall 516 is formed at the periphery of the lower surface 512b of the electrode holding section 512. A concave section 517 is formed by the circumferential wall 516 in the lower surface 512b of the electrode holding section 512. The processing electrode 518 in a discoidal shape is mounted horizontally to the end of the circumferential wall 516. A through-hole 519 is formed in the center of the electrode holding section 512. A number of through-holes 519 are formed in the processing electrode 518 for supplying the processing liquid 502 to the substrate W. The processing electrode 518 is designed to have a radius larger than the radius of the substrate W.

The electrode-rotating shaft 513 in a hollow cylindrical shape is mounted vertically on the upper surface 512a of the electrode holding section 512. A hollow passage 520 is formed in the electrode-rotating shaft 513, and the hollow passage 520 communicates with the through-hole 519 of the electrode holding section 512. The hollow motor 542 is coupled to the upper end 513a of the electrode-rotating shaft 513, and the hollow portion 542c of the hollow motor 542 communicates with the hollow passage 520. A hollow portion 548 is formed at the connection of the pivot arm 543 with the hollow motor 542, and the hollow portion 548 communicates with the hollow portion 542c. The hollow motor 542 is provided on the lower surface 543a of the pivot arm 543 in the vicinity of the free end 543c of the pivot arm 543.

An electric wire 524, which is connected to the upper surface 518a of the processing electrode 518, passes through the concave section 517, the through-hole 519, the hollow passage 520, the hollow portion 542c and the hollow portion 548, through a slip ring 526 provided on the upper surface 543b of the pivot arm 543, and then through a hollow portion 539 formed in the pivot arm 543 and in the pivot shaft 544, and connects with the power source 523. A processing liquid supply inlet 528 as a fluid supply section is formed in the electrode-rotating shaft 513, and a processing liquid supply means (not shown) supplies the processing liquid 502 to the supply inlet 528 of the electrode-rotating shaft 513.

The substrate holding section 514 has a discoidal shape, and is disposed horizontally. The substrate holding section 514 sucks and holds the substrate W on the upper surface 514a that the electrodeposited Cu surface faces upwardly. A through-hole 521 is formed in the center of the substrate holding portion 514.

The substrate-rotating shaft 515 in a hollow cylindrical shape is mounted vertically on the lower surface 514b of the substrate holding section 514. A hollow passage 522 is formed in the substrate-rotating shaft 515, and the hollow passage 522 communicates with the through-hole 521 of the substrate holding section 514. The hollow motor 541 is coupled to the lower end 515b of the substrate-rotating shaft 515. The hollow portion 541c of the hollow motor 541 communicates with the hollow passage 522.

An electric wire 525, which is connected to the lower surface WB, i.e. the copper layer 6 (see FIG. 13B) of the substrate W, passes through the through-hole 521, the hollow passage 522 and the hollow portion 541c, and then through a slip ring 527 provided on the lower surface 541b of the hollow motor 541, and connects with the power source 523. The electrolytic processing apparatus 511 of the present embodiment is of the direct feeding type which feeds electricity directly to the substrate W. The substrate W is disposed in parallel with the processing electrode 518.

Figure 7A:
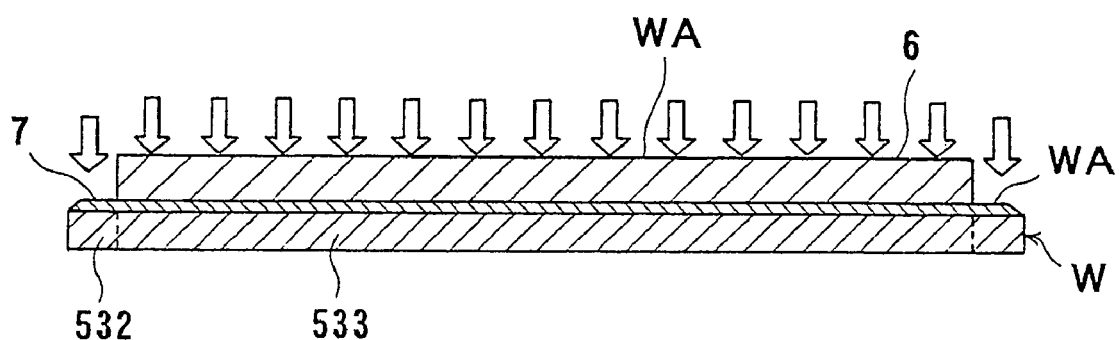
FIGS. 7A and 7B are cross-sectional views illustrating a configurational change of a substrate when it is processed by the electrolytic processing apparatus of FIG. 6.

As shown in FIG. 7A, the substrate W, which is to be held by suction on the upper surface 514a (see FIG. 6) of the substrate holding section 514, may be of the shape of a thin disc in which a seed layer 7 (e.g. copper seed layer) as a film, or as a first film is formed all over the upper surface WA, and a copper film (plated layer) 6 as a film, or as a second film is formed in the effective device portion 533 of the substrate, i.e. the other portion of the substrate W other than the peripheral portion 532. Typically, the copper film 6 is formed more thickly than the seed layer 7. Further, the substrate W has such a film formation that there is a step between the peripheral portion 532 and the effective device portion 533. Incidentally, regarding FIGS. 7A and 7B, the seed layer 7 and the copper film 6 are drawn more thickly than the real ones.

The operation of the electrolytic processing apparatus 511 of this embodiment will now be described by referring to FIG. 6.

The substrate W is placed on the upper surface 514a of the substrate holding section 514 and held by suction thereon. The pivot motor 545 pivots, via the pivot shaft 544, the pivot arm 543 about the pivot shaft 544, whereby the electrode holding section 512 is pivoted horizontally by the pivot arm 543 and reaches a position right above the substrate holding section 514. Thereafter, the vertical movement motor 547 rotates the ball screw 546 and lowers the pivot shaft 544, and the pivot shaft 544 lowers, via the pivot arm 543, the electrode holding section 512 toward the substrate holding section 514, so that the upper surface WA of the substrate W comes close to the lower surface 518b of the processing electrode 518.

The processing liquid 502 is supplied by a processing liquid supply means (not shown) to the processing liquid supply inlet 528. The processing liquid 502 passes through the hollow passage 520, the through-hole 519, the concave 517 and the through-holes 529, and is supplied to the entire upper surface WA of the substrate W from the entire surface 518b, facing the substrate W, of the processing electrode 518. Thereafter, a voltage is applied from a power source 523 between the processing electrode 518 and the substrate W. In this embodiment, the voltage is applied so that the processing electrode 518 side becomes a cathode, and the substrate W side becomes an anode. Then, the electrode holding portion 512 is rotated eccentrically (rotation U) at a predetermined angular rate by the hollow motor 542 via the electrode-rotating shaft 513, and the substrate holding section 514 is rotated (rotation L) at a predetermined angular rate by the hollow motor 541 via the substrate-rotating shaft 515. It is preferable that the hollow motors 541 and 542 respectively eccentrically rotate, and thereby rotate the electrode holding portion 512 and the substrate W in such a manner that the processing electrode 518 can process the entire upper surface WA of the substrate W periodically, and removal processing of the seed layer 7 and the copper film 6 can be effected at a uniform processing rate. Incidentally, since the processing electrode 518 rotates eccentrically and the substrate W rotates, the processing electrode 518 moves relative to the substrate W.

Next, the vertical movement motor 547 further rotates the ball screw 546 to further lower the electrode holding section 512 to a position at which the processing electrode 518 and the upper surface WA of the substrate W are opposed to each other at a slight distance. Therefore, treatment of the substrate W, i.e. electrolytic processing of the copper film 6 and the seed layer 7, is carried out.

Since the lower surface 518b of the processing electrode 518 and the upper surface WA of the substrate W, as a workpiece or as a feeding electrode, are thus opposed and close to each other, when water, pure water or ultrapure water, for example, is used as the processing liquid 502, water molecules dissociate into hydroxide ions ($OH^-$) and hydrogen ions ($H^+$). By the flow of the liquid and by the electric field between the substrate W and the processing electrode 518, the density of the hydroxide ions ($OH^-$), produced by the dissociation of water molecules, increases in the vicinity of the upper surface WA of the substrate W, whereby a reaction between the atoms of the copper film 6 and the hydroxide ions ($OH^-$) and a reaction between the atoms of the seed layer 7 and the hydroxide ions ($OH^-$) can occur. The reaction products of these reactions are removed from the substrate W. Removal processing of the copper film 6 and the seed layer 7 is thus effected.

Figure 7B:
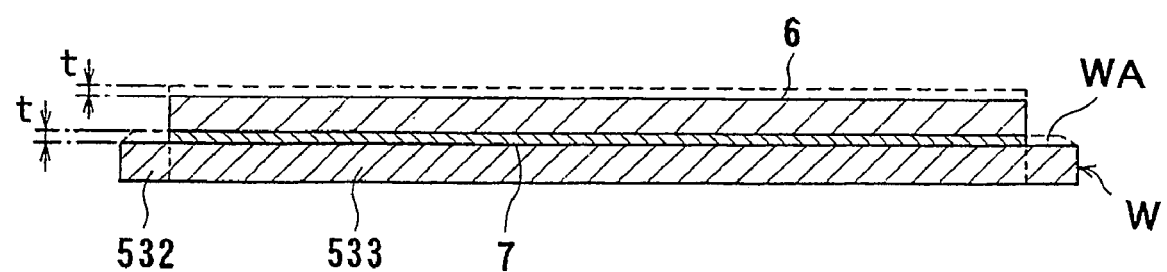

The processing of the substrate W is terminated at the time when the removal of the seed layer 7 in the peripheral portion 532 is completed, as shown in FIG. 7B. In FIG. 7B, the broken lines denote the surface of the substrate before the processing. By the processing, the film in the upper surface WA of the substrate W is removed by an even thickness t over the entire upper surface WA simultaneously. The seed layer 7 in the peripheral portion 532 is thus completely removed, whereas the copper film 6 in the effective device portion 533 still remains. Selective peeling or complete removal of the seed layer 7 in the peripheral portion 532 can thus be achieved.

According to this embodiment, the end portion of the complete film removal region in the substrate surface WA naturally corresponds to the boundary between the peripheral portion 532 and the effective device portion 533, meaning that the complete film removal width is automatically determined. Further, since the so-called electrolytic bevel processing can be performed simultaneously with processing of the effective device portion 533, the number of process steps can be decreased. The electrolytic processing apparatus of this embodiment can thus simplify the film removal step for peeling or completely removing the seed layer 7 in the peripheral portion 532 and perform processing of the peripheral portion 532 without the necessity of control of the processing region.

Next, the vertical movement motor 547 reverses the rotation of the ball screw 546 to raise the electrode holding section 512, and the rotation (rotation U) of the electrode holding section 512 by the hollow motor 542 and the rotation (rotation L) of the substrate holding section 514 by the hollow motor 541 are terminated. The voltage application by the power source 523 is also terminated. The pivot motor 545 pivots the pivot arm 543 via the pivot shaft 544, thereby pivoting horizontally the electrode holding portion 512 away from the position right above the substrate holding portion 514. The substrate W is then taken out of the substrate holding section 514.

It is desirable to use as the processing liquid 502 a liquid obtained by adding an additive, such as a surfactant, to water, pure water or ultrapure water, and having an electric conductivity of not more than 500 μS/cm, preferably not more than 50 μS/cm, more preferably not more than 10 μS/cm, especially preferably not more than 0.1 μS/cm. The use of such a liquid makes it possible to carry out clean processing, without leaving impurities, or dipolar molecules having a strong adhesion to the processed surface, on the substrate surface WA and reduce roughness of the processed surface, whereby a cleaning step for cleaning the substrate W after the electrolytic processing can be simplified.

An aqueous solution of a neutral salt such as NaCl or $Na_2SO_4$, an acid such as HCl or $H_2SO_4$, or an alkali such as ammonia may also be used as the processing liquid 502, and may be properly selected according to the properties of a workpiece (substrate).

Figure 8:
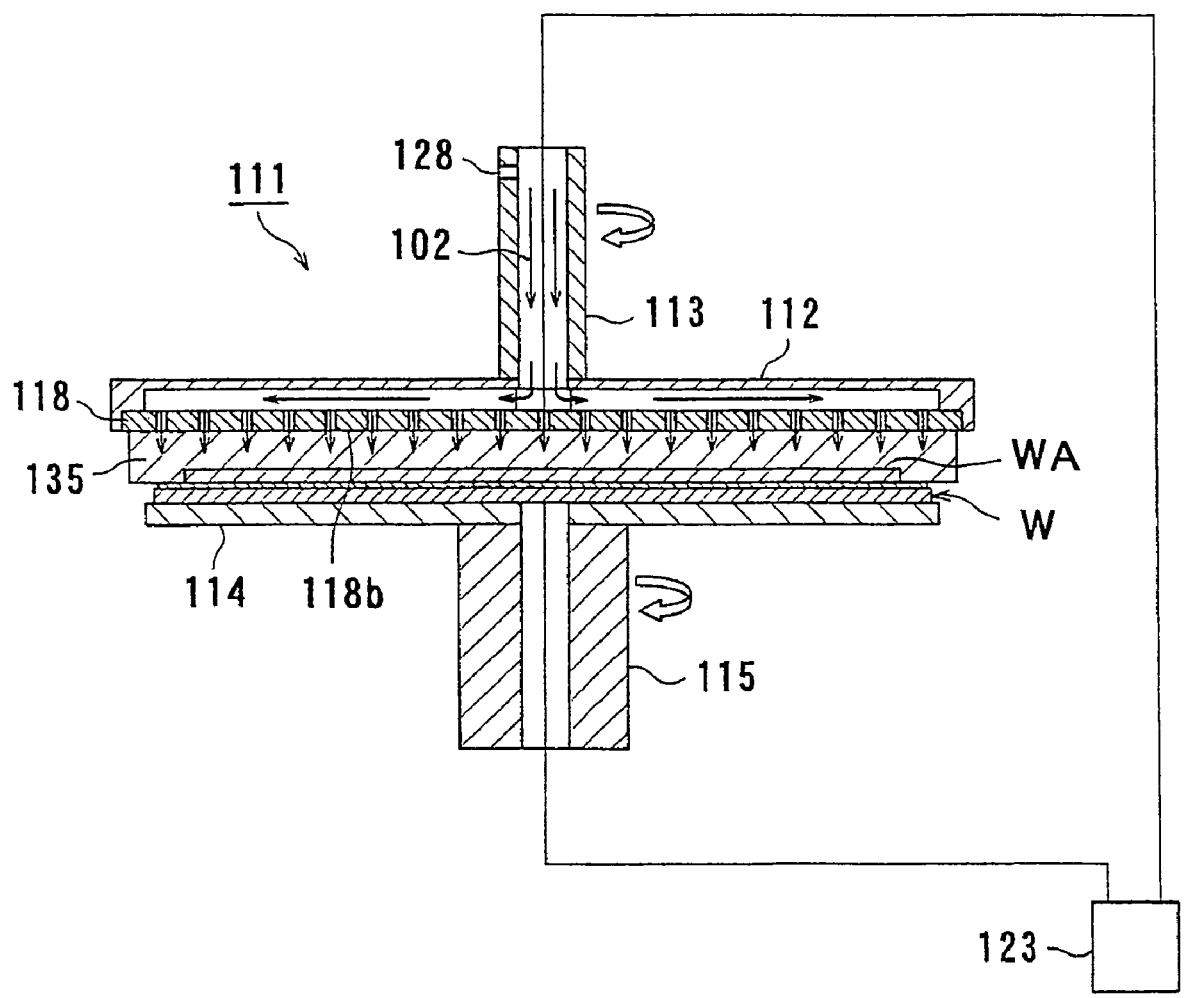
FIG. 8 is a schematic sectional view of an electrolytic processing apparatus (substrate processing apparatus) according to still another embodiment of the present invention.

FIG. 8 is a schematic sectional view of an electrolytic processing apparatus 111 as a substrate processing apparatus according to still another embodiment of the present invention. Compared to the electrolytic processing apparatus 511 shown in FIG. 6, the electrolytic processing apparatus 111 of this embodiment differs in that an ion exchanger 135 is mounted on the lower surface 118b of a processing electrode 118 such that it covers the entire lower surface 118b, the other construction of the electrolytic processing apparatus 111 being the same as the electrolytic processing apparatus 511. The electrolytic processing apparatus 111 of this embodiment is also of the direct feeding type which feeds electricity directly to the substrate W. As with the electrolytic processing apparatus 511 of FIG. 6, a processing liquid 102 is supplied from a processing liquid supply inlet 128 as a fluid supply section, a voltage is applied from a power source 123 between the processing electrode 118 and the substrate W, and the substrate W shown in FIG. 7A can be processed.

In FIG. 8, the description of a hollow motor which is connected to an electrode-rotating shaft 113 and rotates an electrode holding section 112, a pivot arm, a pivot shaft, a pivot motor, a slip ring mounted on the pivot arm, a hollow motor which is connected to a substrate-rotating shaft 115 and rotates a substrate holding section 114, a slip ring mounted on the hollow motor, a ball screw and a vertical movement motor is omitted.

According to the electrolytic processing apparatus 111 of this embodiment which is provided with the ion exchanger 135, in carrying out processing of the substrate W, a vertical movement means (not shown) lowers the electrode holding section 112 until the ion exchanger 135 comes into contact with the upper surface WA of the substrate W.

Due to the provision of the ion exchanger 135, the operation of the electrolytic processing apparatus 111 differs from that of the electrolytic processing apparatus 511 shown in FIG. 6, as explained below.

According to the electrolytic processing apparatus 111 of this embodiment, when water, pure water or ultrapure water, for example, is supplied as the processing liquid 102, the processing liquid 102 supplied flows between the substrate W and the ion exchanger 135. The ion exchanger 135 then effectively promotes the dissociation of the processing liquid 102 to produce plenty of hydroxide ions and hydrogen ions. By the flow of the processing liquid 102 and by the electric field between the substrate W and the processing electrode 118, the density of hydroxide ions increases in the vicinity of the upper surface WA of the substrate W, whereby reaction between the atoms of the copper film 6 and hydroxide ions and reaction between the atoms of the seed layer 7 and hydroxide ions can occur. The use of the ion exchanger 135, which can produce plenty of hydroxide ions, can further enhance the density of hydroxide ions in the vicinity of the substrate upper surface WA, enabling an efficient processing to remove a predetermined even thickness of film simultaneously from the seed layer 7 and from the copper film 6 over the entire upper surface WA of the substrate W and thereby shortening the processing time. The predetermined thickness should at least be the thickness of the seed layer 7 in the peripheral portion 532 of the substrate.

The ion exchanger 135 may either be of a single layer structure or of a multi-layer laminated structure. Some of the processing products (hydroxides and ions) of the electrolytic reactions accumulate on the surface or in the inside of the ion exchanger, and the amount of the accumulation depends upon the ion exchange capacity of the ion exchanger. When the amount of the accumulated processing products exceeds the ion exchange capacity of the ion exchanger, the accumulated products can change their forms, which can affect the processing rate and its distribution. Accordingly, it is necessary not to accumulate the processing products in the ion exchanger in an amount exceeding the ion exchange capacity, or to remove the accumulated products from the ion exchanger. A multi-layer laminated ion exchanger generally has an enhanced ion exchange capacity.

Figure 9:
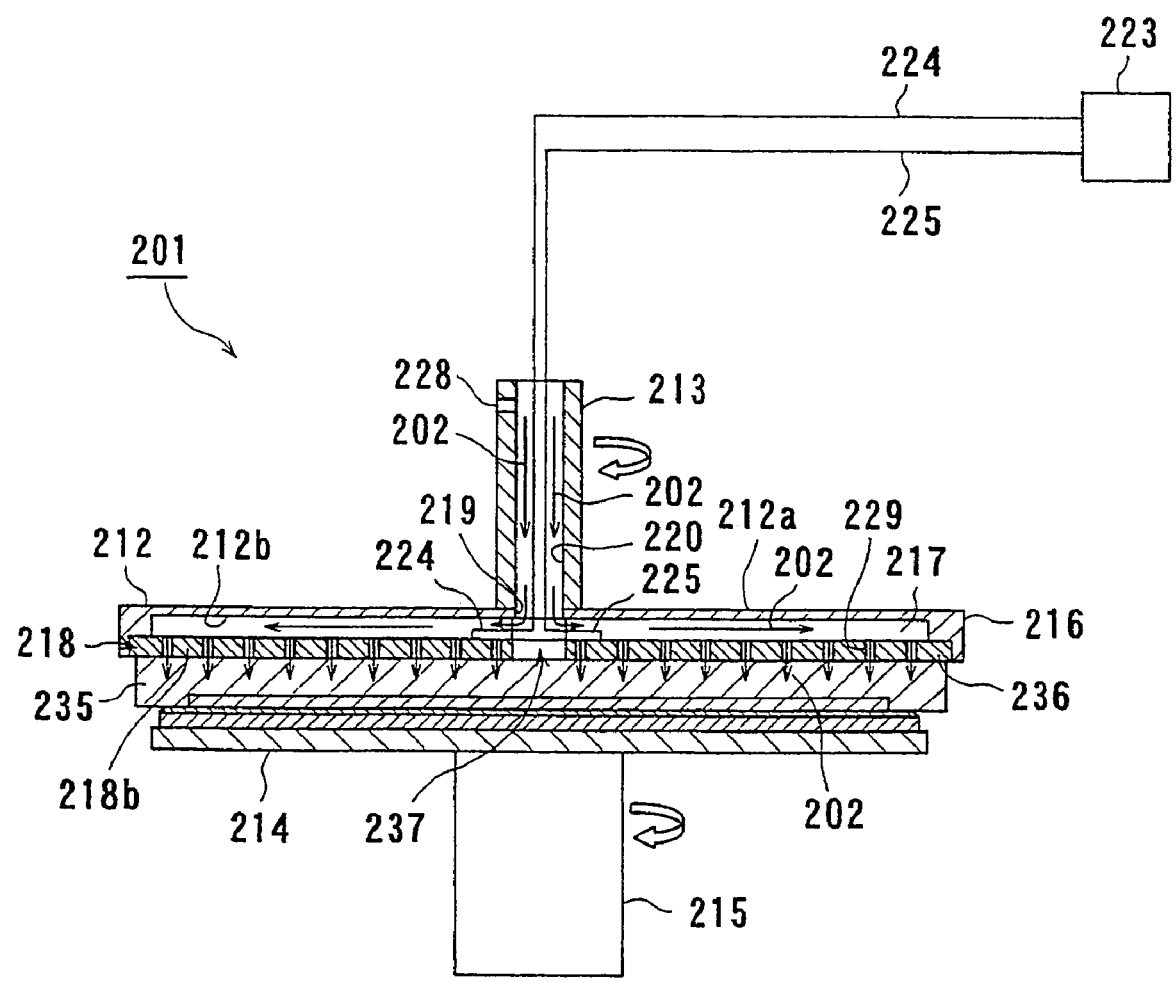
FIG. 9 is a schematic sectional view of an electrolytic processing apparatus (substrate processing apparatus) according to still another embodiment of the present invention.

FIG. 9 is a schematic sectional view of an electrolytic processing apparatus 201 as a substrate processing apparatus according to still another embodiment of the present invention.

As with the electrolytic processing apparatus 111 shown in FIG. 8, the electrolytic processing apparatus 201 of this embodiment includes an electrode holding section 212, a substrate holding section 214, a processing electrode 218 and an ion exchanger 235. The ion exchanger 235 is mounted on the lower surface 218b of the processing electrode 218 such that the ion exchanger 235 covers the entire lower surface 218b. A concave section 217 is formed by a circumferential wall 216 in the lower surface 212b of the electrode holding section 212. A through-hole 219 is formed in the center of the electrode holding section 212.

Further, a number of through-holes 229 are formed in the processing electrode 218 for supplying a processing liquid 202 as a fluid to the substrate W. An electrode-rotating shaft 213 in a hollow cylindrical shape is mounted vertically on the upper surface 212A of the electrode holding section 212. A hollow passage 220 is formed in the electrode-rotating shaft 213, and the hollow passage 220 communicates with the through-hole 219 of the electrode holding section 212. A processing liquid supply inlet 228 is formed in the electrode-rotating shaft 213, and the processing liquid supply inlet 228 communicates with the hollow passage 220. The processing liquid 202 supplied to the processing liquid supply inlet 228 passes through the hollow passage 220, the through-hole 219, the concave section 217 and the through-holes 229, and is supplied from the entire surface 218b, facing the substrate W, of the processing electrode 218. According to the electrolytic processing apparatus 201 of this embodiment, as with the electrolytic processing apparatus 111 shown in FIG. 8, the substrate W shown in FIG. 7A can be processed.

In FIG. 9, the description of a hollow motor which is connected to the electrode-rotating shaft 213 and rotates the electrode holding section 212, a pivot arm, a pivot shaft, a pivot motor, a slip ring mounted on the pivot arm, a motor which is connected to a substrate-rotating shaft 215 and rotates the substrate holding section 214, a ball screw and a vertical movement motor, is omitted.

The electrolytic processing apparatus 201 of this embodiment has the same construction as the electrolytic processing apparatus 111 shown in FIG. 8, except for the following respects.

According to the electrolytic processing apparatus 201 of this embodiment, a hollow passage is not formed in the substrate-rotating shaft 215, that is, the substrate-rotating shaft 215 comprises a solid shaft. The motor (not shown in FIG. 9), connected to the substrate-rotating shaft 215, for rotating the substrate holding section 214 does not have a hollow portion, and a slip ring is not mounted on the motor. A hollow portion for passing therethrough an electric wire is not formed in the pivot arm and in the pivot shaft (both not shown in FIG. 9).

In the case of the electrolytic processing apparatus 111 shown in FIG. 8, as described above, the processing electrode 118 is mounted on the electrode holding section 112, and the substrate W, held by suction on the substrate holding section 114, functions as a feeding electrode. According to the electrolytic processing apparatus 201 of this embodiment, on the other hand, feeding electrode 236, together with the processing electrode 218, is mounted on the electrode holding section 212, and an insulator section 237 is provided between the processing electrode 218 and the feeding electrode 236. Thus, the electrolytic processing apparatus 201 of this embodiment is of the so-called one side feeding type.

An electric wire 225 connected to the feeding electrode 236, together with an electric wire 224 connected to the processing electrode 218, passes through the concave section 217, the through-hole 219, the hollow passage 220, a hollow portion (not shown) formed in a hollow motor (not sown) for rotating the electrode holding section 212 and a hollow portion (not shown) formed in the pivot arm (not shown), and further through a slip ring (not shown) provided on the upper surface of the pivot arm, and connects with a power source 223.

Figure 10:
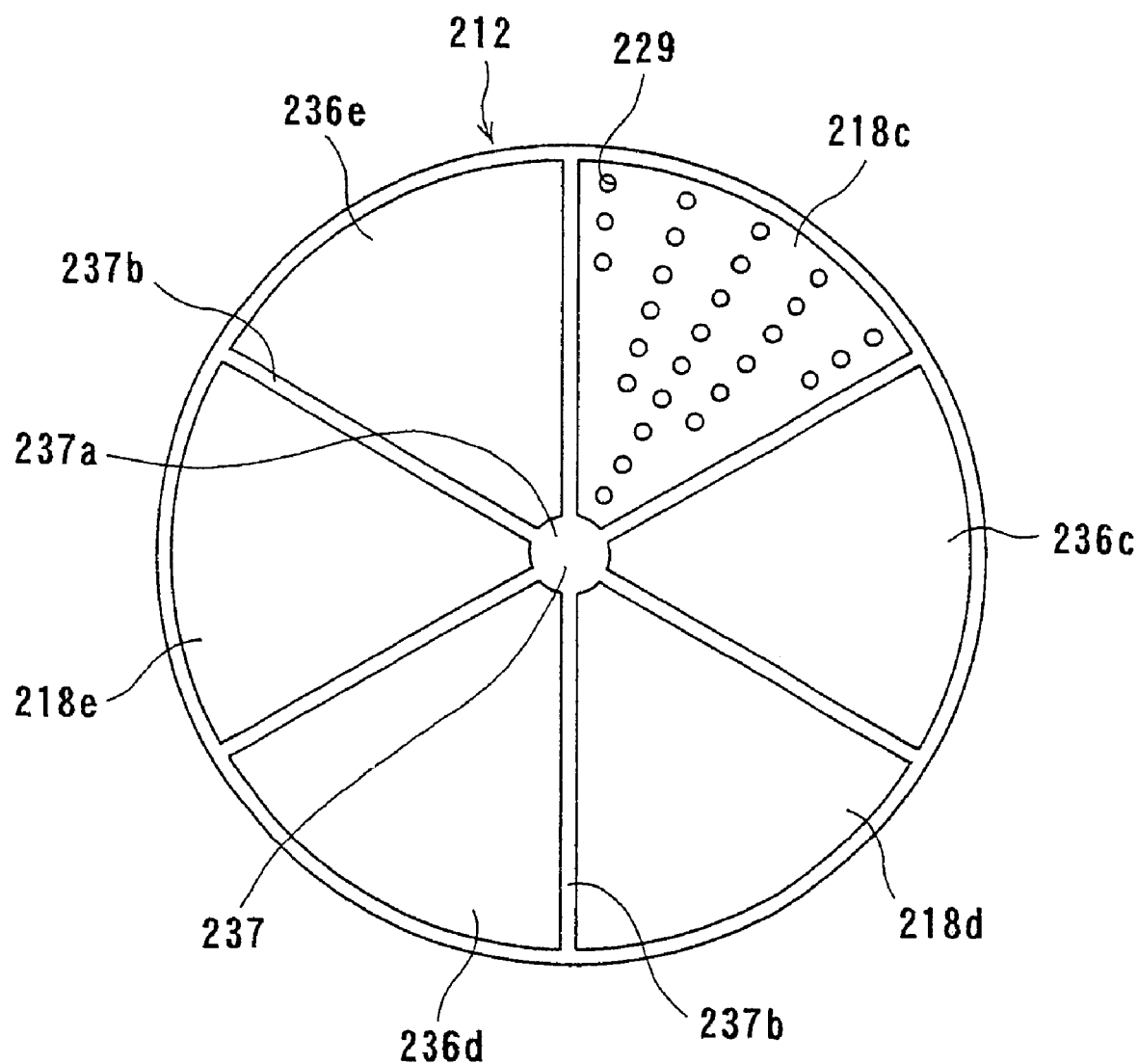
FIG. 10 is a bottom plan view illustrating the arrangement of the processing electrode and the feeding electrode of the electrolytic processing apparatus of FIG. 9.

As shown in FIG. 10, the processing electrode 218 may be composed of three fan-shaped processing electrode elements 218c to 218e, and the feeding electrode may be composed of three fan-shaped feeding electrode elements 236c to 236e; and the processing electrode elements 218c to 218e and the feeding electrode elements 236c to 236e may be disposed alternately in the circumferential direction. The insulator section 237 may include a portion 237a disposed in the center of the electrode holding section 212 and a portion 237b disposed radially between the processing electrode elements 218c to 218e and the feeding electrode elements 236c to 236e. Through-holes 229, in which the processing liquid 202 flows, may be formed in the processing electrode elements 218c to 218e and the feeding electrode elements 236c to 236e. In FIG. 10, only the through-holes 229 formed in the processing electrode element 218c are shown. Though not shown, through-holes 229 are likewise formed in the other processing electrode elements 218d and 218e and in the feeding electrode elements 236c to 236e.

As shown in FIGS. 9 and 10, electric wires are connected to the processing electrode elements 218c to 218e and to the feeding electrode elements 236c to 236e. Three electric wires (only one is shown) for the processing electrode elements 218c to 218e are assembled into one electric wire 224, and three electric wires (only one is shown) for the feeding electrode elements 236c to 236e are assembled into one electric wire 225; and the electric wires 224, 225 are connected, via the concave section 217, the through-hole 219, the hollow passage 220 and a slip ring (not shown), to the power source 236.

The electrolytic processing apparatus 201 of this embodiment operates in almost the same manner as the electrolytic processing apparatus 111 shown in FIG. 8, except that the substrate W held on the substrate holding section 214 does not function as a feeding electrode.

The electrolytic processing apparatus 201 of this embodiment, owing to the provision of the ion exchanger 235, can perform an efficient electrolytic processing. Further, since the substrate W is not utilized as a feeding electrode, not only a conductive substrate W, but also a non-conductive substrate W on which a conductive film is formed, can be processed.

Incidentally, in the above-described electrolytic processing apparatus 511 shown in FIG. 6, instead of mounting the disc-shaped processing electrode 518 on the electrode holding section 512, it is possible to mount such a disc-shaped electrode (processing and feeding electrodes) as shown in FIG. 10 in which processing electrode elements and feeding electrode elements are disposed alternately in the circumferential direction, thereby making the electrolytic processing apparatus a one side feeding type instead of the direct feeding type.

In this case, the electric wire 524 connected to each processing electrode element and the electric wire 525 connected to each feeding electrode element together pass through the concave section 517, the through-hole 519, the hollow passage 520, the hollow portion 542c and the hollow portion 548, and further through the slip ring 526 provided on the upper surface 543b of the pivot arm 543, and connect with the power source 523. Thus, the electric wire 525 is not connected to the copper film 6 (see FIG. 7A and FIG. 13B) of the substrate W.

Figure 11:
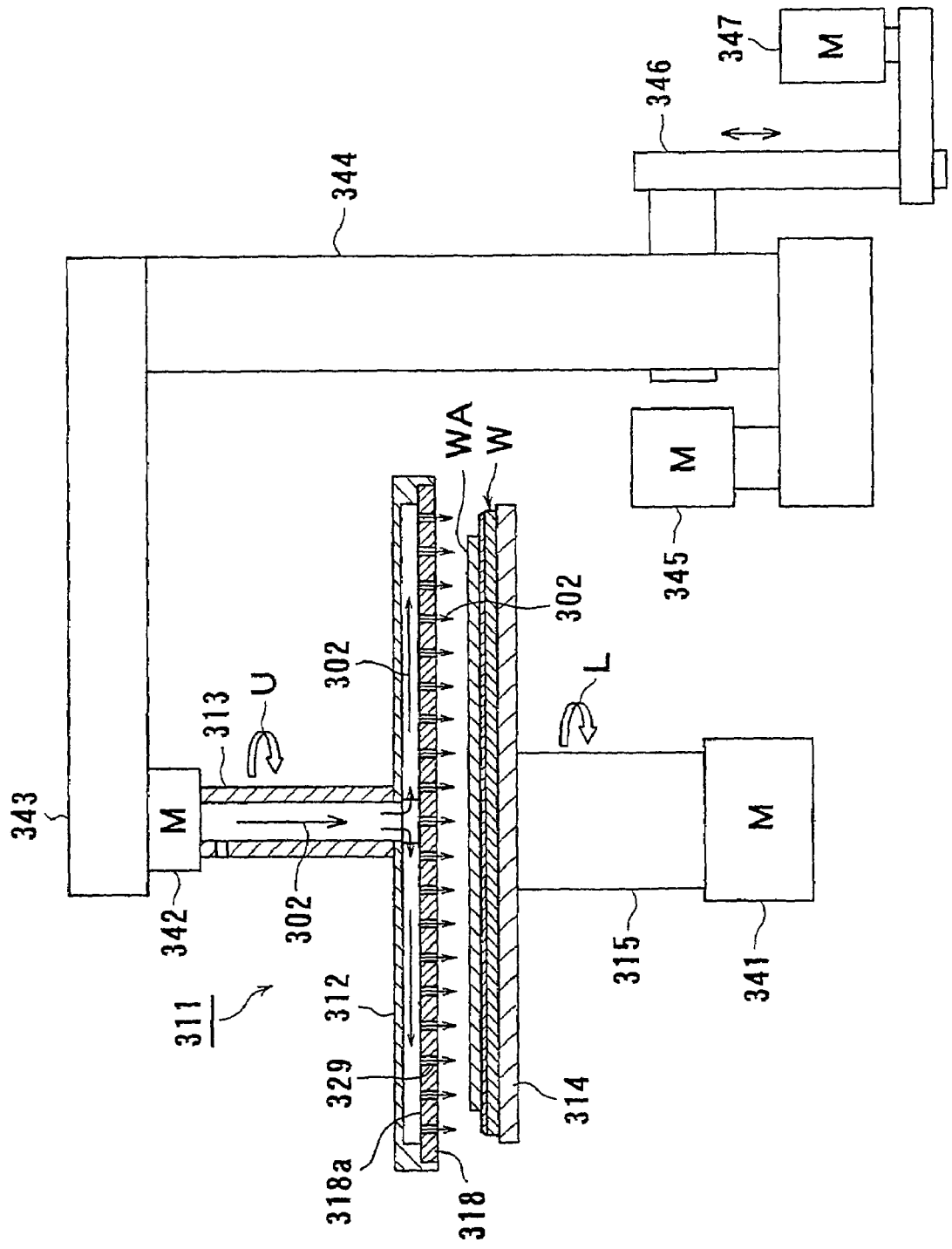
FIG. 11 is a schematic sectional view of a chemical etching apparatus (substrate processing apparatus) according to an embodiment of the present invention.

FIG. 11 is a schematic sectional view of a chemical etching apparatus 311 as a substrate processing apparatus according to an embodiment of the present invention. The chemical etching apparatus 311 of this embodiment is a chemical etching apparatus, which uses an etching liquid 302 instead of a processing liquid, and, as compared to the electrolytic processing apparatus 511 shown in FIG. 6, has the below-described constructional differences. As with the electrolytic processing apparatus 511 shown in FIG. 6, the substrate W shown in FIG. 7A can be etch-processed by this chemical etching apparatus 311.

The chemical etching apparatus 311 includes a processing head holding section 312 which holds a disc-shaped processing head 318. A processing head-rotating shaft 313 for rotating the processing head 318 is secured to the processing head holding section 312. The processing head holding section 312, the processing head-rotating shaft 313 and the processing head 318 respectively have the same shapes as the electrode holding section 512, the electro-rotating shaft 513 and the processing electrode 518 shown in FIG. 6. As with the electrode-rotating shaft 513 shown in FIG. 6, the processing head-rotating shaft 313 rotates the processing head 318. A number of through-holes 329 are formed in the processing head 318 for passing therethrough the etching liquid 302 and supplying the etching liquid 302 to the entire upper surface WA of the substrate W.

The chemical etching apparatus 311 is not provided with a power source, and a voltage is not applied between the processing head 318 and the substrate W. Accordingly, the chemical etching apparatus 311 does not have an electric wire and is not provided with a slip ring. Further, a hollow passage for passing therethrough an electric wire is not formed in a substrate-rotating shaft 315 which is secured to a substrate holding section 314.

The chemical etching apparatus 311 also includes a motor 341 as a substrate-rotating means for rotating the substrate holding section 314 secured to a substrate-rotating shaft 315 via the substrate-rotating shaft 315 (rotation about the central axis of the substrate-rotating shaft 315 (rotation L)); a motor 342 as a processing head-rotating means for eccentrically rotating the processing head holding section 312 secured to the processing head-rotating shaft 313 about a vertical axis (rotation U); a pivot arm 343, a pivot shaft 344 and a pivot motor 345, as a processing head-pivoting means for pivoting the processing head holding section 312 toward a position right above the substrate holding section 314, or pivoting the processing head holding section 312 horizontally from the position right above the substrate holding section 314; a ball screw 346 and a vertical movement motor 347, as a vertical movement means for raising the processing head holding section 312 away from the substrate holding section 314, or lowering it close to the substrate holding section 314; and an etching liquid supply means (not shown) as a fluid supply means for supplying an etching liquid 302 as a fluid. The pivot arm 343 is driven by the pivot motor 345, and pivots the processing head holding section 312. The ball screw 346 is driven by the vertical movement motor 347, and raises and lowers the pivot shaft 344, the pivot arm 343 and the processing head holding section 312.

The operation of the chemical etching apparatus 311 of this embodiment differs from that the electrolytic processing apparatus 511 shown in FIG. 6 in the following respects. The etching liquid 302 is used instead of the processing liquid 502, and a voltage is not applied between the processing head 318 and the substrate W.

The chemical etching apparatus 311 of the present embodiment can perform etch-processing of e.g. a copper-plated substrate as shown in FIG. 7A, having a seed layer (copper seed layer) 7 and a copper film (plated layer) 6. As the etching liquid 302, an oxidative acid (e.g. $HNO_3$ solution) which can dissolve copper, a combination of an oxidizing agent and an acid (e.g. $H_2O_2$ and HF solution), an alkali liquid (e.g. conc. $NH_4OH$), an organic acid solution, an organic alkali solution, etc. may be used.

According to this embodiment, the seed layer 7 and the copper film 6 of the substrate W can be etched by the etching liquid 302 at a uniform etch-processing rate. The etch-processing of the substrate W is terminated at the time when the removal of the seed layer 7 in the peripheral portion 532 is completed, as shown in FIG. 7B. By the etch-processing, the film in the upper surface WA of the substrate W is removed by an even thickness t over the entire upper surface WA simultaneously. The seed layer 7 in the peripheral portion 532 is thus completely removed, whereas the copper film 6 in the effective device portion 533 still remains.

The chemical etching apparatus 311 of this embodiment can thus simplify removal of the seed layer 7 in the peripheral portion 532 and securely remove the seed layer 7. Since the end portion of the complete film removal region in the substrate surface WA naturally corresponds to the boundary between the peripheral portion 532 and the effective device portion 533, the complete film removal width is automatically determined. Further, since the so-called bevel etching can be performed simultaneously with processing of the effective device portion 533, the number of process steps can be decreased.

The above-described apparatuses shown in FIGS. 6 through 11 are of the so-called "face-up type", according to which the substrate is held by suction on the substrate holding section disposed at a lower position, the processing electrode or the processing head is held by the electrode holding section or by the processing head holding section disposed at an upper position, and the upper surface of the substrate is processed with the lower surface of the processing electrode or of the processing head. It is however possible to employ the so-called "face-down type" according to which the substrate is held by suction by a substrate holding section disposed at an upper position, a processing electrode or a processing head is held by an electrode holding section or by a processing head holding section disposed at a lower position, and the lower surface of the substrate is processed with the upper surface of the processing electrode or of the processing head.

Further, according to the above-described apparatuses, the electrode holding section or the processing head holding section is allowed to rotate eccentrically (rotation U) about a vertical axis. But to make a relative movement between the processing section and the substrate, it is possible to design the apparatuses so that the electrode holding section or the processing head holding section is allowed to make a scroll (orbital) movement or a reciprocating movement. By the scroll movement or reciprocating movement, the processing electrode or the processing head may process the entirety of the opposed surface of the substrate in a periodical manner.

A description will now be given of an electrolytic processing method (substrate processing method) according to an embodiment of the present invention by referring to FIGS. 7A, 7B and FIG. 8.

Taking a copper-plated substrate as an example, the seed layer 7 is first formed over the entire substrate surface WA. Next, the copper film 6 is formed in the effective device portion 533 of the substrate surface WA. Accordingly, the film thus formed has a step between the peripheral portion 532 and the effective device portion 533 of the substrate surface WA. The processing electrode 118 is moved close to the substrate W so that the ion exchanger 135 gets positioned between the substrate W and the processing electrode 118.

The substrate W, the ion exchanger 135 and the processing electrode 118 may be positioned such that the substrate W is in contact with the ion exchanger 135. The processing liquid 102 is supplied between the substrate W and the ion exchanger 135. The processing liquid 102 may be supplied so that it can spread over the entire interspace or interface between the substrate W and the ion exchanger 135. Next, a voltage is applied from the power source 123 to between the processing electrode 118 and the substrate W. Upon the voltage application, the substrate W functions as a feeding electrode. A feeding electrode is thus provided. The processing electrode 118 is then moved relative to the substrate W. The ion exchanger 135 may move together with the processing electrode 118. Further, the processing electrode 118 and the ion exchanger 135 may be moved over the entire surface WA being processed in a periodical manner.

Processing of the substrate W is terminated at the time when the seed layer 7 in the peripheral portion 532 is completely removed. By the processing, the film in the upper surface WA of the substrate W is removed by an even thickness t over the entire upper surface WA simultaneously.

Water molecules dissociate into hydroxide ions ($OH^-$) and hydrogen ions ($H^+$). By the flow of the processing liquid 102 and by the electric field between the substrate W and the processing electrode 118, the density of the hydroxide ions, produced by the dissociation of water molecules, increases in the vicinity of the upper surface WA of the substrate W, whereby reaction between the atoms of the copper film 6 and the hydroxide ions and reaction between the atoms of the seed layer 7 and the hydroxide ions can occur. The reaction products of these reactions dissolve in the processing liquid 102 and, by the flow of the processing liquid 102 along the to-be-placed surface of the substrate W, are removed from the substrate W. Removal processing of the copper film 6 and the seed layer 7 is thus effected.

It is desirable to use as the processing liquid a liquid obtained by adding an additive, such as a surfactant, to water, pure water or ultrapure water, and having an electric conductivity of not more than 500 μS/cm, preferably not more than 50 μS/cm, more preferably not more than 10 μS/cm, especially preferably not more than 0.1 μS/cm. The use of such a liquid makes it possible to carry out clean processing, without leaving impurities on the substrate surface WA, whereby a cleaning step for cleaning the substrate W after the electrolytic processing can be simplified.

Next, a description will be given of an electrolytic processing method (substrate processing method) according to another embodiment of the present invention by referring to FIGS. 7A, 7B and FIG. 9.

Taking a copper-plated substrate as an example, the seed layer 7 is first formed over the entire substrate surface WA. Next, the copper film 6 is formed in the effective device portion 533 of the substrate surface WA. Accordingly, the film thus formed has a step between the peripheral portion 532 and the effective device portion 533 of the substrate surface WA. The processing electrode 218 and the feeding electrode 236 are moved close to the substrate W so that the ion exchanger 235 gets positioned between the substrate W and the processing electrode 218, and between the substrate W and the feeding electrode 236. The processing liquid 202 as a fluid is supplied between the substrate W and the ion exchanger 235. A voltage is applied from the power source 223 to between the processing electrode 218 and the feeding electrode 236. The processing electrode 218, the feeding electrode 236 and the ion exchanger 235 are then moved relative to the substrate W. The processing electrode 218, the feeding electrode 236 and the ion exchanger 235 may be moved over the entire surface WA being processed in a periodical manner.

Processing of the substrate W is terminated at the time when the seed layer 7 in the peripheral portion 532 is completely removed. By the processing, the film in the upper surface WA of the substrate W is removed by an even thickness t over the entire upper surface WA simultaneously.

With the provision of the ion exchanger 235 between the substrate W and the processing electrode 218, and between the substrate W and the feeding device 236, the electric processing method of this embodiment can carry out an efficient electrolytic processing. Further, since the substrate W is not utilized as a feeding electrode, not only a conductive substrate W but also a non-conductive substrate W can be processed.

Figure 12:
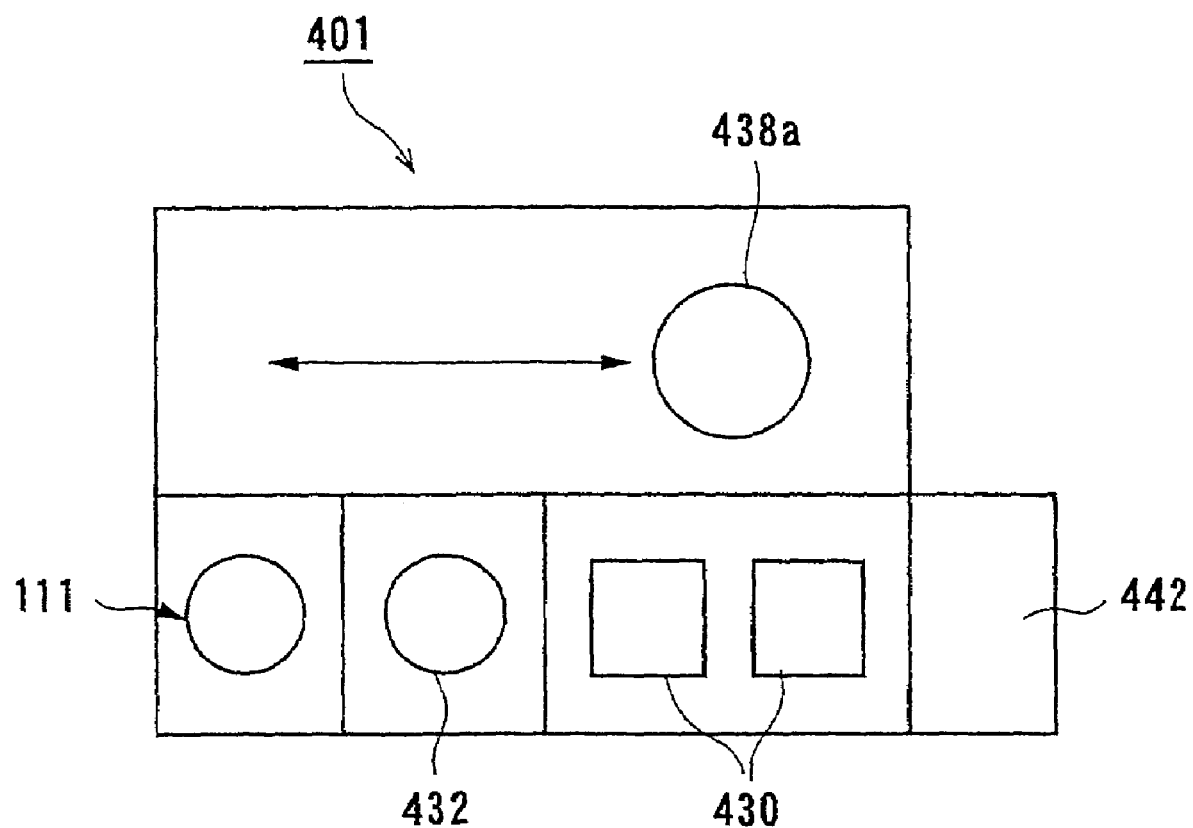
FIG. 12 is a plan view showing a substrate processing system which is provided with a substrate processing apparatus according to the present invention.

A substrate processing system 401, which is provided with the electrolytic processing apparatus (substrate processing apparatus) 111 shown in FIG. 8, will now be described by referring to FIG. 12. Though any of the electrolytic processing apparatus 511 shown in FIG. 6, the electrolytic processing apparatus 201 shown in FIG. 9 and the chemical etching apparatus 311 shown in FIG. 11 may be adopted, a case of adopting the electrolytic processing apparatus 111 is herein taken as an example and will be described by also referring to FIG. 8 as necessary. As shown in FIG. 12, the substrate processing system 401 includes a pair of loading/unloading sections 430 as a substrate carry-in-and-out section for carrying in and out a substrate W (see FIG. 7A and FIG. 13B), a reversing machine 432 for reversing the substrate W, and the electrolytic processing apparatus 111, which are disposed in series. A transfer robot 438a as a transfer device is provided which can move parallel to these apparatuses for transporting and transferring the substrate W therebetween.

The substrate processing system 401 is also provided with a control section 442 for monitoring a voltage applied between the processing electrode 118 (see FIG. 8) and the substrate (feeding electrode) W (see FIG. 8) upon electrolytic processing in the electrolytic processing apparatus 111, or an electric current flowing therebetween, and controlling at least one of the voltage and the electric current independently. The substrate processing system 401, with the provision of the electrolytic processing apparatus 111, can perform in a simple manner an effective removal processing of a substrate W, in which a film is formed in the substrate surface WA such that the film has a step between the peripheral portion 532 (see FIG. 7A) and the effective device portion 533 (see FIG. 7A) of the substrate W, thereby removing the film by a predetermined thickness over the entire surface WA simultaneously, and securely removing the film in the peripheral portion 532 while leaving the film in the effective device portion 533.

When the material of a substrate as a workpiece is copper, molybdenum, iron, tungsten or the like, electrolytic processing action occurs on the cathode side. Therefore, a voltage is applied so that the processing electrode side becomes a cathode and the substrate or feeding electrode side becomes an anode. Conversely, when the material of a substrate is aluminum, silicon or the like, electrolytic processing action occurs on the anode side. Therefore, a voltage is applied so that the processing electrode side becomes an anode and the substrate or feeding electrode side becomes a cathode.

As described hereinabove, the present electrolytic processing apparatuses shown in FIGS. 6 through 10 and the present chemical etching apparatus shown in FIG. 11 both can perform in a simple manner an effective removal processing of a substrate, in which a film is formed in the surface such that the film has a step between the peripheral portion and the effective device portion of the substrate, thereby removing the film by a predetermined thickness over the entire substrate surface simultaneously, and securely removing the film in the peripheral portion and leaving the film in the effective device portion.

The present application is available for PCT/JP02/01545, filed on Feb. 21, 2002, the entire disclosure of which is hereby incorporated by reference.

Although certain preferred embodiments of the present invention have been shown and described in detail, it should be understood that various changes and modifications may be made therein without departing from the scope of the appended claims.

INDUSTRIAL APPLICABILITY

This invention relates to a substrate processing apparatus and method which can be utilized as a bevel-removal apparatus for processing a conductive material or removing impurities adhering to a peripheral portion (bevel portion or edge portion) of a substrate, such as a semiconductor wafer, or which can be used for carrying out a processing to remove a film formed on the surface of a substrate.

The invention claimed is:

1. A substrate processing apparatus comprising:
an electrode section having a plurality of electrodes which are laminated with insulators being interposed therebetween, and having a holding portion shaped and arranged so as to be opposed to only a peripheral portion of a substrate so as to remove conductive material from only the peripheral portion of the substrate;
a liquid supply section for supplying a liquid to the holding portion of the electrode section; and
a power source for applying a voltage to the electrodes of the electrode section so that the electrodes alternately have different polarities.

2. The substrate processing apparatus according to claim 1, further comprising an ion exchanger disposed in the holding portion of the electrode section.

3. The substrate processing apparatus according to claim 2, wherein said ion exchanger has water-absorbing properties.

4. The substrate processing apparatus according to claim 2, wherein said ion exchanger has one or both of an anion-exchange ability and a cation-exchange ability.

5. The substrate processing apparatus according to claim 2, wherein said electrode section is arranged so as to be tilted relative to a horizontal plane, and shaped and arranged so that the substrate can roll on edge over the ion exchanger disposed in the holding portion of the electrode section and can move along the electrode section.

6. The substrate processing apparatus according to claim 1, wherein said liquid is pure water, a liquid having an electric conductivity of not more than 500 µS/cm, or an electrolysis solution.

7. The substrate processing apparatus according to claim 6, wherein said pure water is ultrapure water.

8. The substrate processing apparatus according to claim 1, wherein the peripheral portion of the substrate is a bevel portion of the substrate.

9. The substrate processing apparatus according to claim 8, wherein the bevel portion of the substrate is a region several mm wide extending inward from a peripheral end of the substrate.

10. The substrate processing apparatus according to claim 1, wherein the electrode section is shaped and arranged to face an end of the substrate.

11. The substrate processing apparatus according to claim 10, wherein the electrode section has a groove conforming to a sectional configuration of the peripheral portion of the substrate.

12. The substrate processing apparatus according to claim 11, wherein the groove is shaped to extend in an arc conforming with a shape of the peripheral portion of the substrate.

13. The substrate processing apparatus according to claim 10, wherein the electrode portion comprises a flat plate.

14. The substrate processing apparatus according to claim 1, wherein the holding portion has a U-shaped groove for receiving the peripheral portion of the substrate during application of the voltage to the electrodes of the electrode section by the power source.

15. The substrate processing apparatus according to claim 14, further comprising an ion exchanger on a surface of the U-shaped groove of the holding portion.

16. A substrate processing method comprising:
arranging only a peripheral portion of a substrate to oppose a holding portion of an electrode section having a plurality of electrodes, the electrodes being laminated with insulators being interposed therebetween;
supplying a liquid to the holding portion of the electrode section; and
applying a voltage to the electrodes of the electrode section so that the electrodes alternately have different polarities, thereby removing conductive material from only the peripheral portion of the substrate.

17. The substrate processing method according to claim 16, further comprising:
disposing an ion exchanger in the holding portion of the electrode section.

18. The substrate processing method according to claim 17, wherein said ion exchanger has water-absorbing properties.

19. The substrate processing method according to claim 17, wherein said ion exchanger has one or both of an anion-exchange ability and a cation-exchange ability.

20. The substrate processing method according to claim 16, wherein said liquid is pure water, a liquid having an electric conductivity of not more than 500 µS/cm, or an electrolysis solution.

21. The substrate processing method according to claim 20, wherein said pure water is ultrapure water.

22. The substrate processing method according to claim 16, wherein the peripheral portion of the substrate is a bevel portion of the substrate.

23. The substrate processing method according to claim 22, wherein the bevel portion of the substrate is a region several mm wide extending inward from a peripheral end of the substrate.

24. The substrate processing method according to claim 16, wherein said arranging comprises arranging an end of the substrate to face the electrode section.

25. The substrate processing method according to claim 24, wherein the electrode section has a groove conforming to a sectional configuration of the peripheral portion of the substrate.

26. The substrate processing method according to claim 25, wherein the groove is shaped to extend in an arc conforming with a shape of the peripheral portion of the substrate.

27. The substrate processing method according to claim 24, wherein the electrode portion comprises a flat plate.

* * * * *